(12) United States Patent
Metzler

(10) Patent No.: US 6,368,514 B1
(45) Date of Patent: Apr. 9, 2002

(54) METHOD AND APPARATUS FOR BATCH PROCESSED CAPACITORS USING MASKING TECHNIQUES

(75) Inventor: Richard Metzler, Costa Mesa, CA (US)

(73) Assignee: Luminous Intent, Inc., Costa Mesa, CA (US)

( * ) Notice: Subject to any disclaimer, the term of this patent is extended or adjusted under 35 U.S.C. 154(b) by 0 days.

(21) Appl. No.: 09/387,864

(22) Filed: Sep. 1, 1999

(51) Int. Cl.[7] ................................................ H01G 4/00
(52) U.S. Cl. ........................................ 216/6; 438/462
(58) Field of Search ............................. 216/6; 438/460, 438/462; 430/312, 313, 314

(56) References Cited

U.S. PATENT DOCUMENTS

| | | |
|---|---|---|
| 1,298,396 A | 3/1919 | Pruessman |
| 2,841,508 A | 7/1958 | Roup et al. |
| 3,173,974 A | 3/1965 | Mohr |
| 3,325,699 A | 6/1967 | Hellicar |
| 3,520,054 A | 7/1970 | Pensack et al. |
| 3,582,729 A | 6/1971 | Girard et al. |
| 3,612,963 A | 10/1971 | Piper et al. |
| 3,639,814 A | 2/1972 | Engbert |
| 3,673,092 A | 6/1972 | Dietz |
| 3,720,862 A | 3/1973 | Mason |
| 3,745,508 A | 7/1973 | Bruder et al. |
| 3,943,547 A | 3/1976 | Nagano et al. |
| 3,962,713 A | 6/1976 | Kendall et al. |
| 3,988,405 A | 10/1976 | Smith et al. |
| 3,988,765 A | 10/1976 | Pikor |
| 4,019,248 A | 4/1977 | Black |
| 4,071,881 A | 1/1978 | Bacher |
| 4,081,857 A | 3/1978 | Hanold, III |

(List continued on next page.)

OTHER PUBLICATIONS

Richard C. Dorf, The Electrical Engineering Handbook, 1993, Eight (8) pages, CRC Press, Inc., Boca Raton, Florida.
Merrill L. Minges, Electronic Materials Handbook, Nov. 1989, Eight (8) pages, vol. 1 Packaging, ASM International, Materials Park, OH.

*Primary Examiner*—Randy Gulakowski
*Assistant Examiner*—Jiri Smetana
(74) *Attorney, Agent, or Firm*—Blakely, Sokoloff, Taylor & Zafman LLP

(57) ABSTRACT

Batch thin film capacitors and their methods of manufacture using semiconductor manufacturing techniques. A mask, photo mask or shadow mask, having a pattern is used to form a matrix of rows and columns of thin film capacitors in a wafer. Capacitor terminals are formed in a batch process by separation at column saw areas, depositing a conductive layer and vertically etching horizontal layers of the conductive layer. Capacitance of an individual batch processed thin film capacitor is increased by stacking wafers together prior to separation at the column saw areas and forming capacitor terminals thereafter to couple parallel thin film capacitors together.

86 Claims, 14 Drawing Sheets

U.S. PATENT DOCUMENTS

| | | |
|---|---|---|
| 4,139,935 A | 2/1979 | Bertin et al. |
| 4,389,703 A | 6/1983 | Morel et al. |
| 4,531,268 A | 7/1985 | Rayburn |
| 4,563,724 A | 1/1986 | Behn |
| 4,610,971 A | 9/1986 | Wada et al. |
| 4,680,601 A | 7/1987 | Mitlehner et al. |
| 4,716,134 A | 12/1987 | Yamaguchi et al. |
| 4,752,857 A | 6/1988 | Khoury et al. |
| 4,812,424 A | 3/1989 | Helferich et al. |
| 4,822,757 A | 4/1989 | Sadamori |
| 4,853,827 A | 8/1989 | Hernandez |
| 4,897,373 A | 1/1990 | Inoue et al. |
| 4,959,333 A | 9/1990 | Mori et al. |
| 4,974,050 A | 11/1990 | Fuchs |
| 5,009,744 A | 4/1991 | Mandi et al. |
| 5,036,425 A | 7/1991 | Omori et al. |
| 5,046,236 A | 9/1991 | Wada et al. |
| 5,097,391 A | 3/1992 | Nomura et al. |
| 5,101,254 A | 3/1992 | Hamana |
| 5,117,326 A | 5/1992 | Sano et al. |
| 5,304,274 A | 4/1994 | Crownover et al. |
| 5,318,725 A | 6/1994 | Sandhage |
| 5,365,102 A | 11/1994 | Mehrotra et al. |
| 5,414,588 A | 5/1995 | Barbee, Jr. et al. |
| 5,459,635 A | 10/1995 | Tomozawa et al. |
| 5,486,277 A | 1/1996 | Barbee, Jr. et al. |
| 5,506,421 A | 4/1996 | Palmour |
| 5,583,738 A | 12/1996 | Kohno et al. |
| 5,618,747 A | 4/1997 | Lou |
| 5,635,421 A | 6/1997 | Ting |
| 5,663,089 A | 9/1997 | Tomozawa et al. |
| 5,691,223 A | 11/1997 | Pittikoun et al. |
| 5,698,375 A * | 12/1997 | Park .......................... 430/312 |
| 5,701,025 A | 12/1997 | Yoshimori |
| 5,716,532 A * | 2/1998 | Yializis et al. ................. 216/6 |
| 5,716,884 A | 2/1998 | Hsue et al. |
| 5,728,618 A | 3/1998 | Tseng |
| 5,736,448 A | 4/1998 | Saia et al. |
| 5,741,734 A | 4/1998 | Lee |
| 5,747,369 A | 5/1998 | Kantimahanti et al. |
| 5,757,611 A | 5/1998 | Gurkovich et al. |
| 5,759,907 A | 6/1998 | Assaderaghi et al. |
| 5,795,815 A * | 8/1998 | Vokoun et al. ............. 438/462 |
| 5,827,783 A * | 10/1998 | Hsia et al. .................. 438/735 |
| 5,882,986 A * | 3/1999 | Eng et al. ................... 438/456 |
| 6,080,529 A * | 6/2000 | Ye et al. ..................... 430/318 |

\* cited by examiner

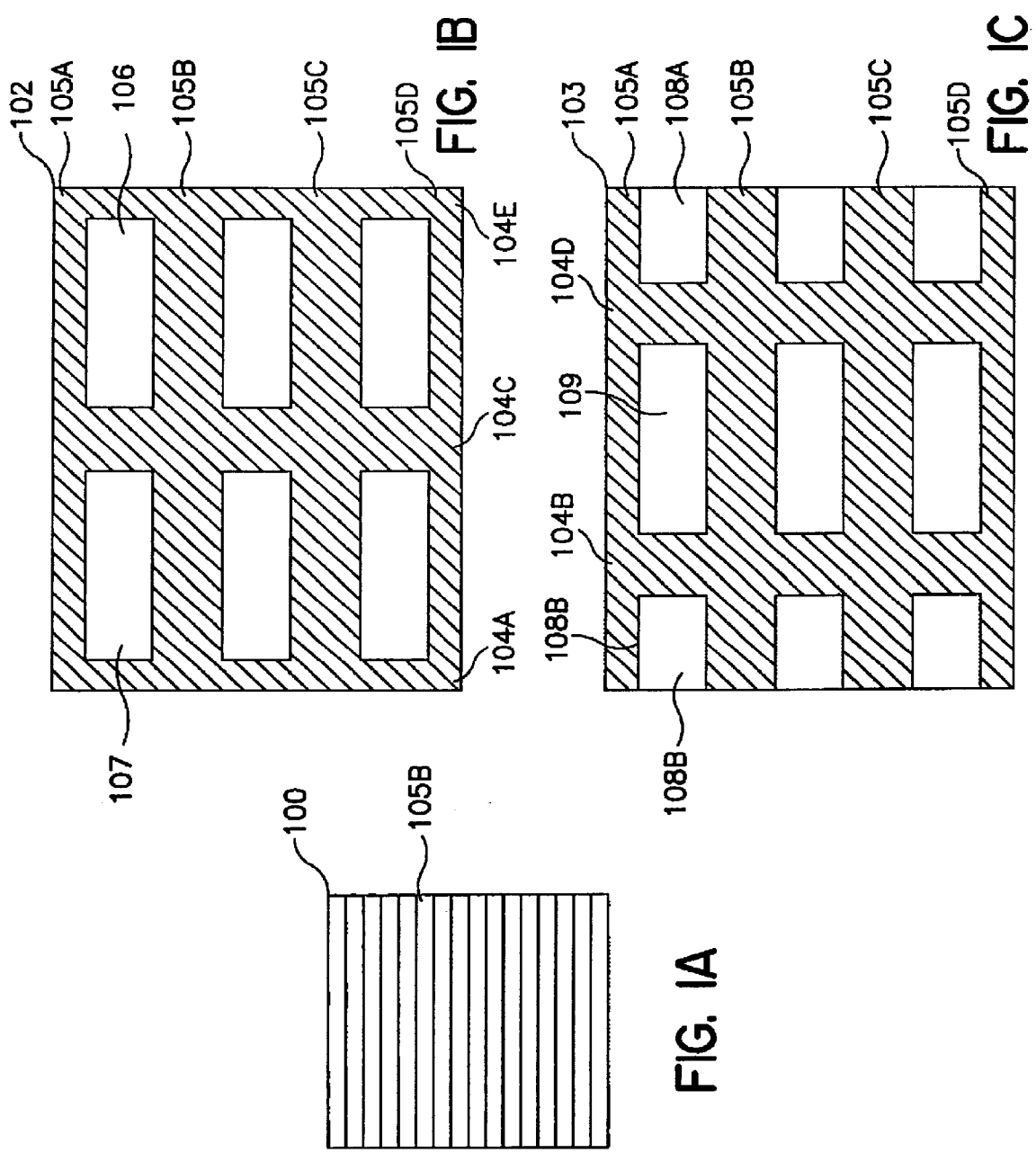

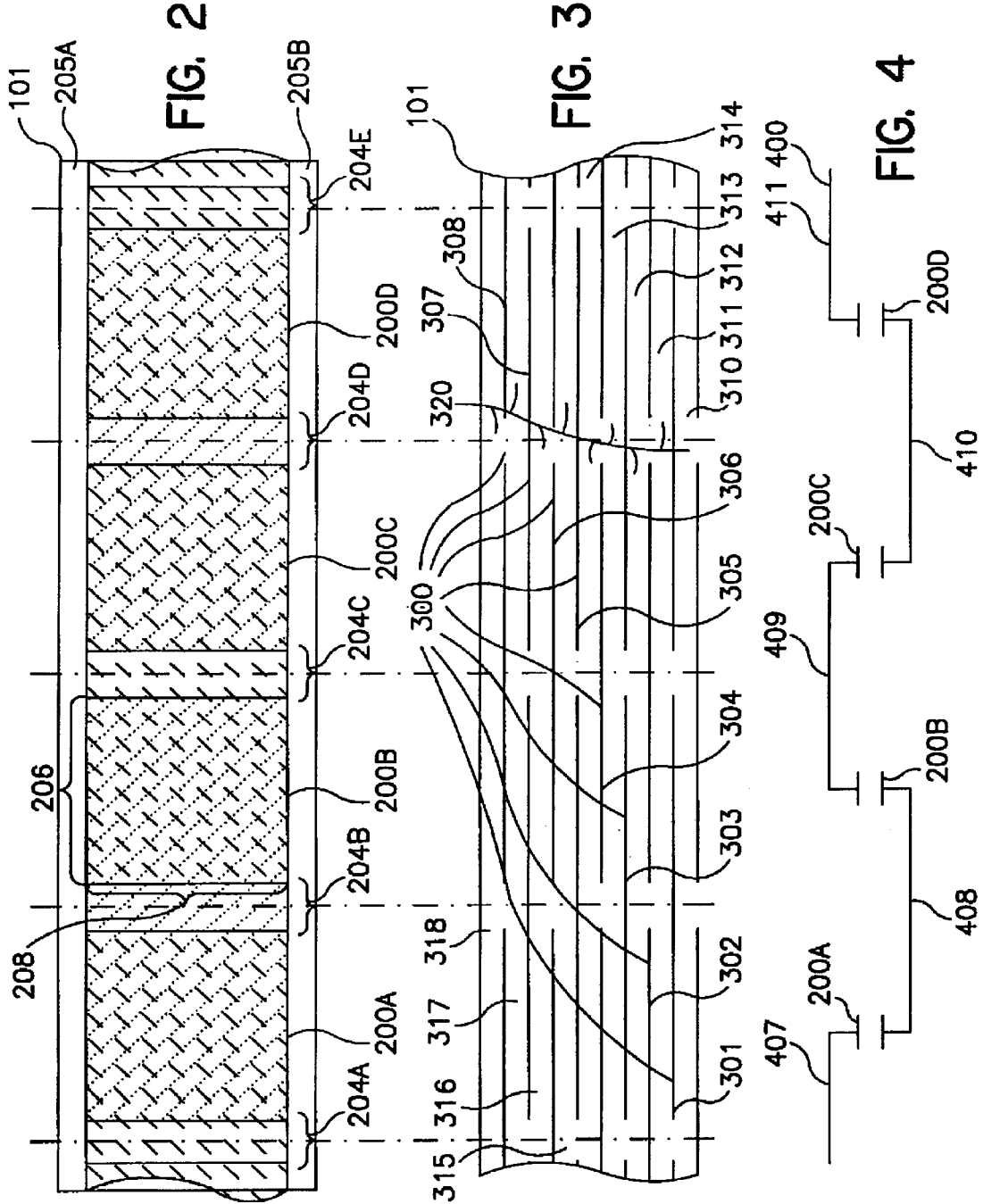

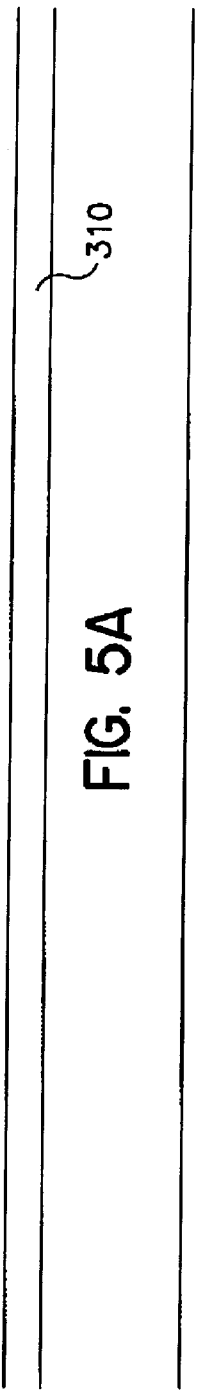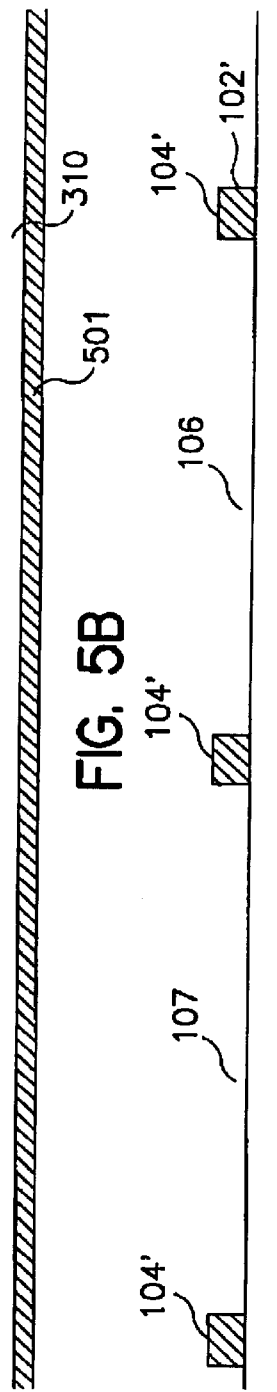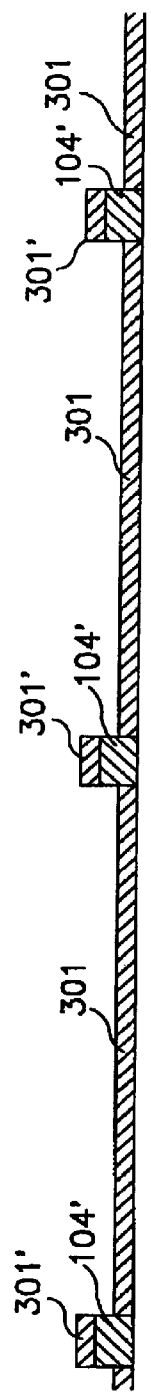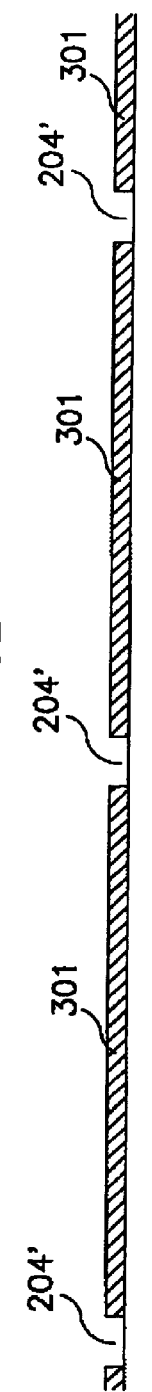

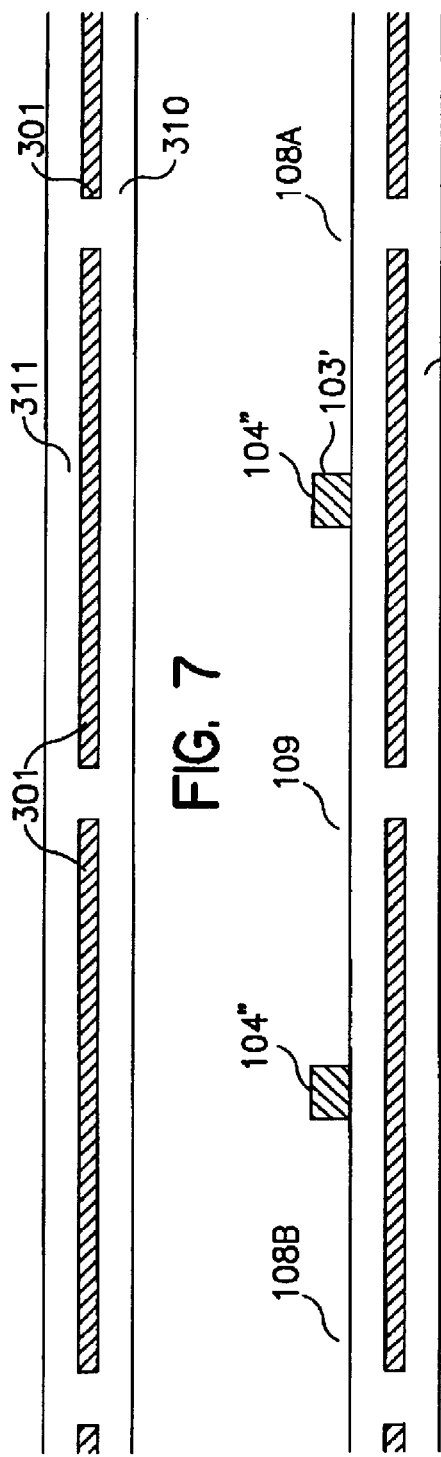
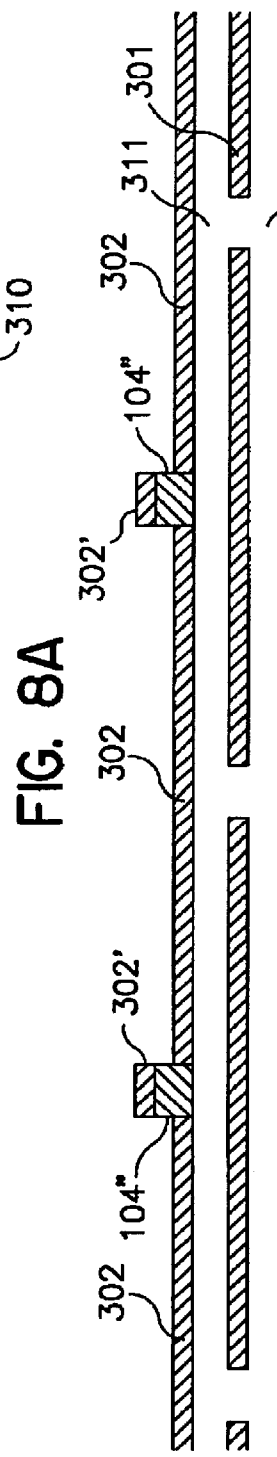
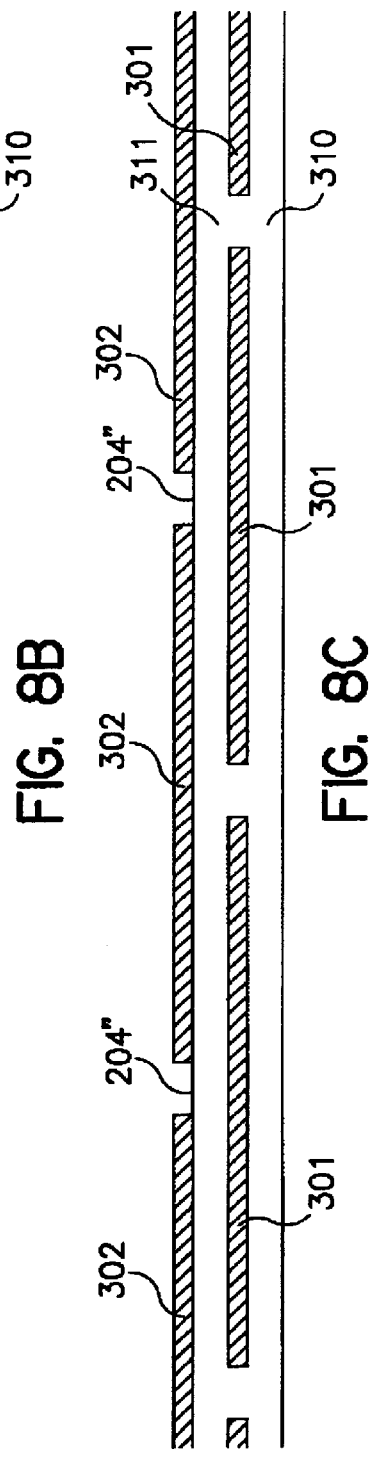
FIG. 7
FIG. 8A
FIG. 8B
FIG. 8C

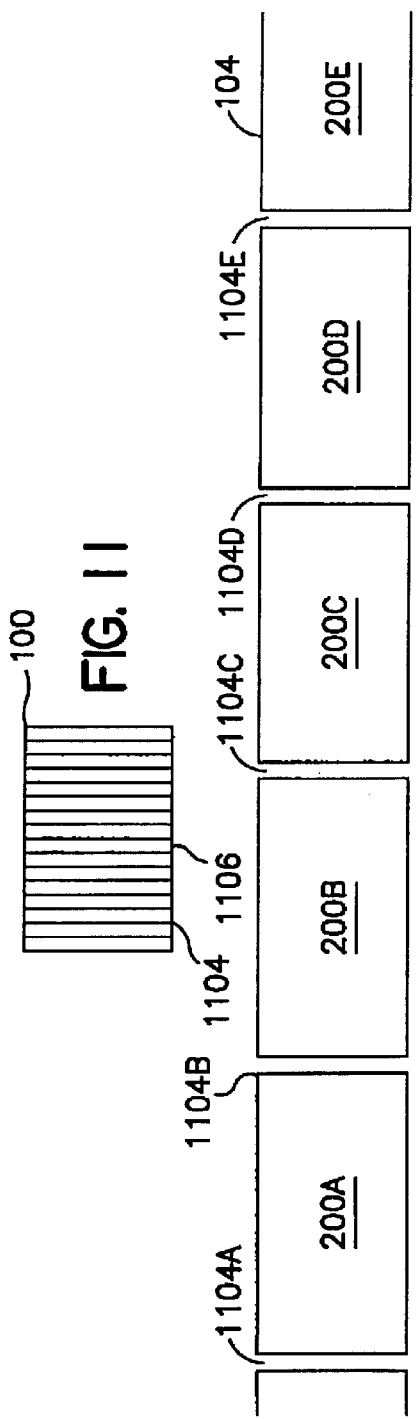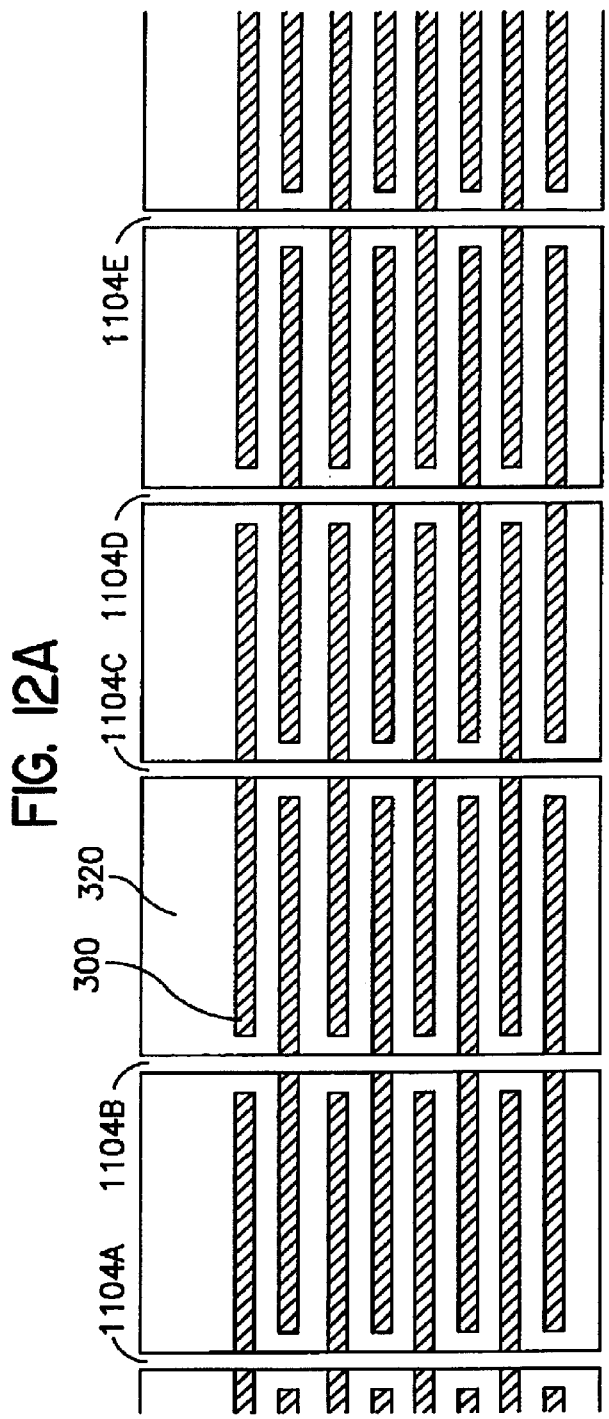

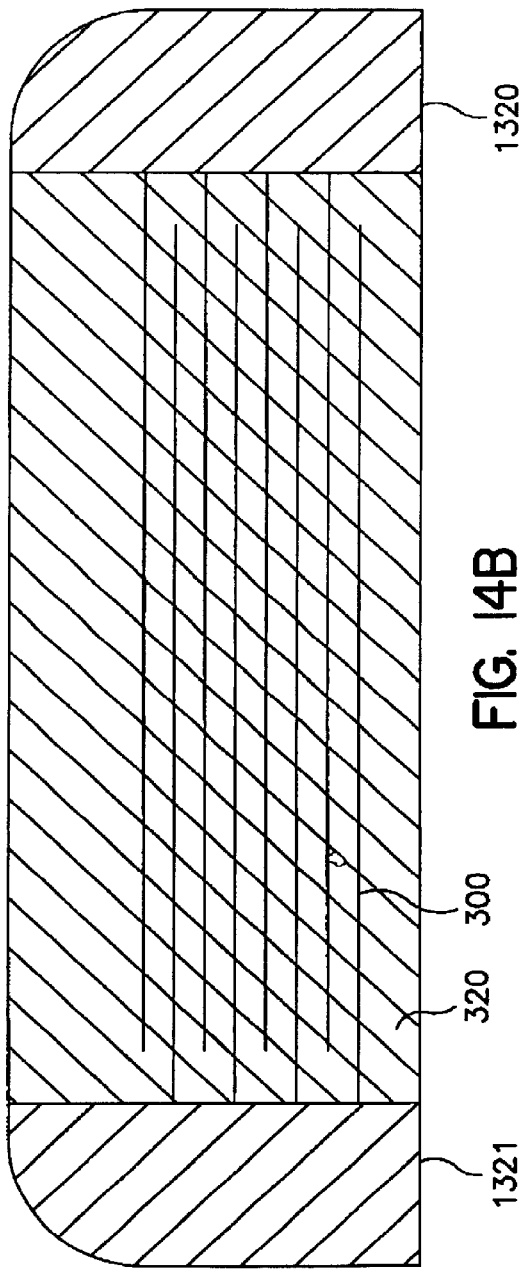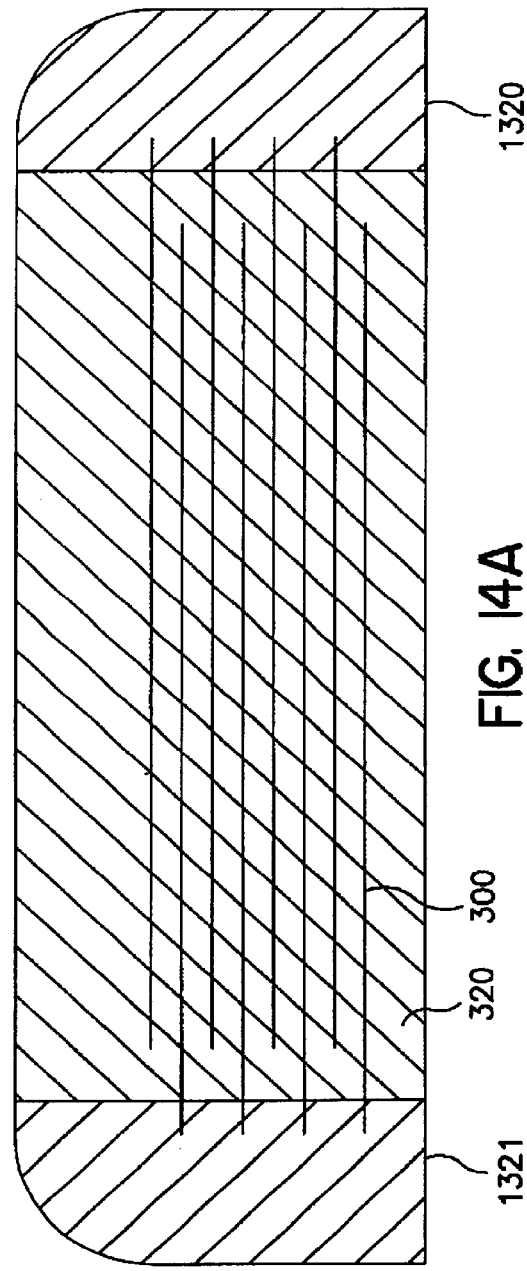

METHOD AND APPARATUS FOR BATCH PROCESSED CAPACITORS USING MASKING TECHNIQUES

FIELD OF THE INVENTION

This invention relates generally to the manufacture of capacitors. More particularly, the invention relates to the manufacture of thin film discrete capacitors in batch process form.

BACKGROUND OF THE INVENTION

A capacitor is a two terminal passive device comprised of conductors separated by one or more dielectric materials, for storage of charge when a potential difference exists between adjacent conductors. The capacitance C of a capacitor is equal to Q/V, where Q is the charge stored by the capacitor and V is the voltage between the conductors.

Various techniques and materials used in manufacturing capacitors are selected to provide the desired capacitance values and other parameters associated with a capacitor, such as the maximum voltage rating, a power rating, stability with time and temperature and/or an upper and lower temperature tolerance. The capacitance C of a capacitor is dependent on the material and dimensions of the capacitor structure, namely $C=\mu A/d$, where $\mu$ is the dielectric constant of the material used for the dielectric between the conductive capacitor plates, A is the overlapping area of adjacent capacitor plates and d is the separation of the overlapping plates. To increase the capacitance of a capacitor, one must increase the capacitor plate area, decrease the separation between capacitor plates and/or use a dielectric with a higher dielectric constant. Accordingly, capacitors connected in parallel increase the amount of total capacitance, while capacitors coupled in series decrease the total capacitance across the series combination.

U.S. Pat. No. 4,017,885 to Kendall et al discloses a semiconductor or integrated circuit capacitor which utilizes grooves in the substrate to increase the capacitance of the capacitor. Other patents disclose various other methods of increasing the capacitance of integrated circuit capacitors used in memory devices such as dynamic random access memories (DRAM). For example, U.S. Pat. No. 5,716,884 discloses a fin-shaped electrode for a DRAM memory cell, increasing capacitance by forming multiple layers of a stacked capacitor. U.S. Pat. No. 5,728, 618 discloses a high capacitance stacked capacitor using one optical mask for two masking steps. U.S. Pat. No. 5,691,223 discloses forming capacitors over bit lines of memory arrays in an integrated circuit. Other patents disclose methods of providing capacitors in the same semiconductor fabrication process as transistors or digital logic elements for processing analog signals or digital signals. For example, U.S. Pat. No. 5,701, 025 discloses a semiconductor integrated circuit that would include a resistor and a capacitor together with an insulated gate transistor on a single semiconductor substrate. The general focus of these and other prior art integrated circuit capacitors is that the capacitors are to be manufactured as part of an integrated circuit device that includes other circuitry such as memory and transistors. They are not focused on resolving problems, increasing capacity or improving manufacturing processes for discrete capacitor components.

Methods of increasing capacitance for discrete capacitors, as opposed to integrated circuit capacitors, have involved stacking capacitors together in parallel or using multiple layers of dielectrics and capacitor plates or laminates. Examples of stacking capacitors together in parallel are described in U.S. Pat. Nos. 5,414,588 and 5,486,277. Examples of using multiple layers are described in U.S. Pat. Nos. 5,335,139; 5,600,533; 5,335,139; 5,853,515; 5,736, 448; 4,853,827; and 4,4470,099 which disclose methods of manufacturing a single discrete capacitive device. However, these prior art patents do not disclose how to manufacture capacitors in a batch process where multiple discrete capacitors are manufactured simultaneously.

U.S. Pat. Nos. 4,531,268; 4,563,724; 5,663,089 and 5,459,635 disclose manufacturing multiple discrete capacitors nearly simultaneously. U.S. Pat. No. 4,531,268 discloses manufacturing multiple capacitors by a mechanical means by using first and second webs, each having a dielectric substrate, a metallic film coating and narrow parallel longitudinal metal-free zones. U.S. Pat. No. 4,563, 724 discloses mother capacitors that are manufactured using mechanical means of tape layers wound onto a drum. Incisions are produced in the mother capacitors so that individual stacks may be subsequently separated from the mother capacitors. While these methods of manufacturing may be satisfactory for certain thicknesses of film capacitors such as thick film, mechanical methods are not the most desirable means for the manufacturing of thin film capacitors. U.S. Pat. No. 5,459,635 and U.S. Pat. No. 5,663,089, related patents, disclose a laminated thin film capacitor having a substrate wherein the metal electrode layers and the dielectric layers are laminated alternately on the substrate, cut to a predetermined size, and then external electrodes are formed by vacuum deposition, sputtering, plating, or coating-baking to obtain a laminated thin film capacitor. While U.S. Pat. No. 5,459,635 and U.S. Pat. No. 5,663,089 disclose using semiconductor manufacturing techniques to manufacture multiple capacitors, their method of forming capacitor terminal electrodes is less than desirable. The terminal electrode formation is not processed in a batch form as are the manufacture of capacitor plates and dielectric layers.

BRIEF SUMMARY OF THE INVENTION

Briefly, the present invention includes a method, apparatus and system for batch processed capacitors using masking techniques as described in the claims. The masking techniques may be a shadow mask (stencil process) or a photolithographic process. Capacitors are manufactured in rows by alternately depositing multiple dielectric layers and multiple conductive layers to form capacitor plates at different layers of the structure. The capacitor plates are staggered from one plate layer to the next plate layer such that pairs of capacitor plates in each row are initially integral, alternate rows being joined at different locations. An initial dielectric layer may be deposited, if desired, on a substrate such as ceramic or silicon. Alternatively the layers may be deposited onto a quick release base such as a Teflon belt. The capacitor plates are then sawed at column saw areas to saw through alternate, initially integral plates at each kerf to provide openings to form the capacitor terminals in the resultant kerfs. Alternatively the capacitors may be laser scribed to separate the capacitor plates of the series of capacitors. A light dielectric etch may be used to further expose he end contact regions of the conductive plates, or a backsputtering may be used to clean the contact regions. Side-wall electrodes are then deposited as one conductive layer to make intimate contact with the conductive plates. The conductor layer is then vertically etched to form individual terminals for each capacitor. The capacitors are then sawn along scribe areas to separate the capacitor structures into individual discreet thin film capacitors. The discrete thin film capacitors may be encapsulated if desired for packaging, or shipped without encapsulation for use on surface mount printed circuit boards. Prior to column separation, additional capacitance may be obtained for a thin film discrete capacitor, without decreasing manufacturing throughput, by stacking multiple capacitor structures together in parallel and then performing column separation of the stacked structures. Further processing of the stacked structures in the formation of capacitor terminals is similar to the processing for forming capacitor terminals on a single unit. Advantages to the present invention will be obvious after reading the disclosure. Various embodiments are disclosed

BRIEF DESCRIPTIONS OF THE DRAWINGS

FIG. 1A is a top view of unseparated batch processed capacitors fabricated in accordance with the present invention.

FIGS. 1B and 1C are top views of shadow masks or stencils for the manufacturing of the rows of the batch processed capacitors of FIG. 1A.

FIG. 2 is a top view of a row of joined capacitors of FIG. 1A.

FIG. 3 is a simplified cross-sectional view of the row portion of joined capacitors of FIG. 2.

FIG. 4 is a schematic diagram of the row of joined capacitors of FIG. 2.

FIGS. 5A and 5B are cross-sectional views of a row during manufacturing illustrating the formation of a first dielectric layer.

FIGS. 6A through 6C are cross-sectional views of a row illustrating the formation of a first conductive layer.

FIG. 7 is a cross-sectional view of a row illustrating the formation of a second dielectric layer.

FIGS. 8A through 8C are cross-sectional views of a row illustrating the formation of a second conductive layer.

FIG. 11 is a top view illustrating the vertical separating of the joined capacitors into columns of capacitors.

FIG. 12A is a top view of a row of columns of joined capacitors, taken on an expanded scale in comparison to FIG. 11, after vertically separating the structure into capacitor columns.

FIG. 12B is a cross-sectional view of a row of the columns of joined capacitors after vertically separating the structure into capacitor columns.

FIGS. 14A and 14B are cross-sectional views of simplified embodiments of the batch processed thin film capacitor.

DETAILED DESCRIPTION OF THE PREFERRED EMBODIMENT

Figure 9:
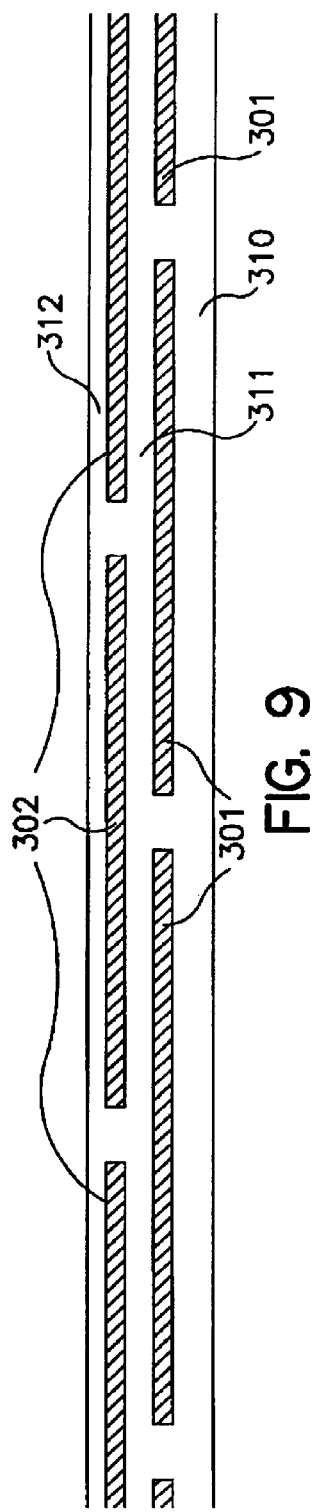
FIG. 9 is a cross-sectional view of a row illustrating the formation of a third dielectric layer.

In the following detailed description of the preferred embodiment, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

Referring to FIG. 1A, a top view of unseparated batch processed capacitors fabricated in accordance with the present invention may be seen. The wafer of capacitors 100 comprises a plurality of insulative and patterned conductive layers defining a number of parallel capacitor rows 101, each capacitor row 101 consisting of a series of capacitors coupled together. The procedures used to deposit and etch materials in the manufacture of the wafer of capacitors 100 may be similar to wafer manufacturing for very large scale integrated circuit (VLSI) manufacturing. U.S. Pat. No. 5,663,089 and U.S. Pat. No. 5,459,635, related patents, are exemplary of using wafer manufacturing procedures to manufacture thin film capacitors and are incorporated herein by reference. If photolithographic masking techniques are used to define the capacitor layers, the materials and processes may be similar to VLSI integrated circuit manufacturing. However, it is preferable to use shadow mask or stencil techniques to define the patterned capacitor layers, as it is a lower cost manufacturing technique in comparison to photolithography techniques used for the manufacture of integrated circuits, and provides tapered metal edges to reduce stress.

A shadow mask is a relatively thin and flat patterned plate, usually metal, having openings defining the areas through which material will be deposited. In the use of the shadow mask, the mask is placed over the part being manufactured to make physical contact with, or be in close proximity with, the previous layer of material. If the shadow mask is used in close proximity instead of physical contact with the previous layer of material, it may be dithered (i.e. slightly moved in a circular manner) to provide additional tapering of the metal edges. The open areas in the shadow mask allow deposited material to build up on the surface of the product being processed, while the solid areas of the shadow mask keep material from being deposited onto the product there below. The deposition techniques used preferably are those associated with VLSI wafer manufacturing. In addition to the shadow mask manufacturing process requiring fewer steps and thus being less expensive, the shadow mask process forms a product with lower internal stresses by providing tapered edges in the deposited material. This substantially reduces the stresses due to differential expansion of the different materials in the region of the edges of the patterned layers.

Referring now to FIGS. 1B and 1C, shadow masks 102 and 103 to generate the patterned conductive layers of capacitor rows 101 may be seen. Because layer alignment is not critical and the patterns for masks 102 and 103 are the same but laterally displaced, a single mask can be shifted right or left for the deposition of each conductive layer forming the capacitor plates to perform the masking function of the other mask. However, in the description to follow, the two masks will be referred to, making clear the positioning of a single mask if only one mask is used. In a section of mask 102 illustrated in FIG. 1B, pairs of capacitor plate openings 106 and 107 are arranged in three rows to define scribe areas 105A through 105D in rows between the plates, and column areas 104A, 104C, and 104E in columns between the plates. In a corresponding section of the second shadow mask 103 illustrated in FIG. 1C, split capacitor plates 108A and 108B and capacitor plates 109 are arranged in rows to define scribe areas 105A through 105D in rows between the plates, and column areas 104B and 104D in columns between the plates. These patterns are typically repeated numerous times over the area of the shadow mask(s)

Referring now to FIG. 2, a portion of one of the rows 101 of a plurality of capacitors coupled together is illustrated. The portion of capacitor row 101 illustrated includes a pair of scribe line rows 205A and 205B and a plurality of column saw areas 204A through 204E. Capacitor row 101 includes capacitors 200A through 200D. The scribe line rows 205A and 205B are shared with adjacent capacitor rows and correspond to the scribe areas 105A through 105D defined by the shadow masks 102 and 103. The column saw areas 204A through 204E are shared with the capacitors in other rows, and correspond to the column areas 104A through 104E defined by the masks 102 and 103. The rows of scribe areas and the columns of column saw areas define a matrix of rows and columns of capacitors. The capacitance value of each of the capacitors 200A through 200D depends on the designed overlap area of the capacitor plates, the number of capacitor plates formed during manufacturing, the selection of dielectric material and its thickness between the plates. The patterns in a mask which is shifted, or in a pair of masks, defining the capacitor rows 101, establishes the x dimension 206 and the y dimension 208 of the overlapping areas of the capacitor plates, the dimensions of the non-overlapping areas, and scribe line areas.

Referring now to FIG. 3, a simplified cross-sectional view of a portion of a capacitor row 101 may be seen. The capacitor row 101 comprises multiple conductive capacitor plates 300 (conductive layers 301 through 308, also referred to as capacitor plates 301 through 308) separated by layers of a dielectric 320 (dielectric layers 310–318). The odd capacitor plates are staggered with respect to the even plates in order to form the interleaved layers of capacitor plates having the overlapping and non-overlapping regions as shown in FIG. 3, and to define the column saw areas 204A through 204E.

Referring now to FIG. 4, an equivalent schematic diagram for a portion of the capacitor row 101 may be seen. Because the capacitor plates of adjacent capacitors in a row are initially coupled together, capacitors 200A through 200D are schematically illustrated as being coupled in series by connections 407 through 411. After the capacitor plates have been defined, connections 407 through 411 are broken by sawing through or otherwise separating the columns at the column saw areas 204A through 204E to separate capacitors 200A through 200D from one another. References are now made to FIGS. 5A through 15B illustrating the formation of the rows of capacitors to describe detailed manufacturing processes used in the fabrication of the batch processed capacitors of the present invention. The formation of the generally unpatterned dielectric layers and the patterned conductive layers of the batch processed capacitors is through thin film depositions. Referring now to FIGS. 5A and 5B, the initial step is to deposit a first dielectric layer 310, typically over an area on the order of one-eighth inch square to twelve inches square or more. The choice of material for the dielectric layers as well as the thicknesses used depends upon a number of factors including the desired voltage capability of the resulting capacitor. Typical dielectrics include a borophosphosilicate glass (BPSG), a tantalum-oxide, a silicon-dioxide layer or other depositable dielectric layer such as silicon nitride or oxi-nitride film. The dielectric is deposited by use of known methods most suitable for the selected dielectric material. For example, the dielectric may be deposited by thermal or plasma chemical vapor deposition methods or by vacuum deposition methods. The first dielectric layer 310 may be deposited with or without a substrate. FIG. 5A illustrates depositing the first dielectric layer 310 without using a substrate by depositing it onto a Teflon belt, which provides a quick release for the final product. FIG. 5B illustrates depositing the first dielectric layer 310 on a substrate 501. The substrate 501 may be a ceramic or silicon substrate, by way of example.

Referring now to FIGS. 6A through 6C, the deposition of the first conductive layer 301 for the capacitor plates 300 is schematically illustrated. In FIG. 6A, a shadow mask 102' has been brought into contact with the first dielectric layer 310. The shadow mask 102' has openings 106 and 107 between solid regions 104' that allow material to be deposited onto corresponding regions of the first dielectric layer 310. In FIG. 6B, the first conductive layer 301 is deposited on top of the first dielectric layer 310 in the openings 106 and 107 defining the capacitor plates 301. A portion 301' of the first conductive layer 301 is additionally deposited on top of the mask areas 104' rather than the underlying first dielectric layer 310. Areas 104' in the shadow mask 102' correspond to the scribe areas 105A through 105D and column saw areas 104A, 104C and 104E of the first mask 102 of FIG. 1B. The shadow mask can typically be used five to ten times before the mask requires cleaning of the deposited material from the mask areas 104'.

The conductive material used to form the layers of the capacitor plates 300 is preferably a metal or alloy of copper, silver, aluminum, gold, platinum, titanium or a conductive ceramic or nitrite. The thickness of the conductive layer for the capacitor plates, such as the first conductive layer 301, is preferably in the range of 0.01 microns to 5 microns. The conductive layer is deposited by use of known methods most suitable for the selected conductive material. For example, the conductive layer may be deposited by vacuum deposition or sputtering.

After the deposition, the shadow mask 102' is lifted away from the first dielectric layer 310, leaving behind the material deposited through its openings. FIG. 6C illustrates the remaining conductive layer 301, defining the capacitor plate layer 301 and having gaps 204' defined by the shadow mask. The gaps 204' correspond with the scribe areas 205A and 205B and column saw areas 204A, 204C and 204E of FIG. 2. The conductive layer 301 with gaps 204' now defines the first capacitor plate layer 301. In practice, the edges of the conductive layer will be tapered because of the shadowing effect of the shadow mask. After forming the first capacitor plate layer 301, another dielectric layer may be deposited on top of the first capacitor plate layer 301.

FIG. 7 illustrates the second dielectric layer 311 deposited on top of conductive layer 301 and within the gaps 204' merging with the first dielectric layer 310. (For clarity, the second dielectric layer, and subsequent layers, are shown as being flat, though in practice the pattern of underlying patterned layers will print through to layers there-above.) The second dielectric layer 311 is deposited using the same techniques as the first dielectric layer. The thickness of the dielectric layer between capacitor plates, such as the second dielectric layer 311, is preferably in the range of 0.05 microns to 3 microns. After depositing the second dielectric layer 311, the second capacitor plate layer 302 is deposited on top of the second dielectric layer 311.

Referring now to FIGS. 8A through 8C, the manufacturing steps used to form the second capacitor plate layer 302 are illustrated. In FIG. 8A, a shadow mask 103' is aligned and brought into contact with the second dielectric layer 311. The shadow mask 103' may be a different pattern which aligns with the shadow mask 102' or shadow mask 103' may be shadow mask 102' shifted left or right enough to align the second layer of the capacitor plates. The shadow mask 103' has solid areas 104", and openings 108A, 108B, and 109 that allow material to be deposited in a pattern against the first dielectric layer 311. In FIG. 8B, the second conductive layer 302 has been deposited on top of the second dielectric layer 311 in the openings 108A, 108B, and 109. A portion 302' of the second conductive layer 302 is additionally deposited on top of the mask areas 104" rather than the underlying second dielectric layer 311. FIG. 8C illustrates the second conductive layer 302 having gaps 204" and conductive material defining the second capacitor plate layer 302 after having the shadow mask 103' lifted away. Gaps 204" correspond with the scribe areas 205A and 205B and column saw areas 204B and 204D of FIG. 2. After forming the second capacitive plate layer 302, a third dielectric layer 312 may be deposited on top of the second capacitor plate layer 302.

Figure 10:
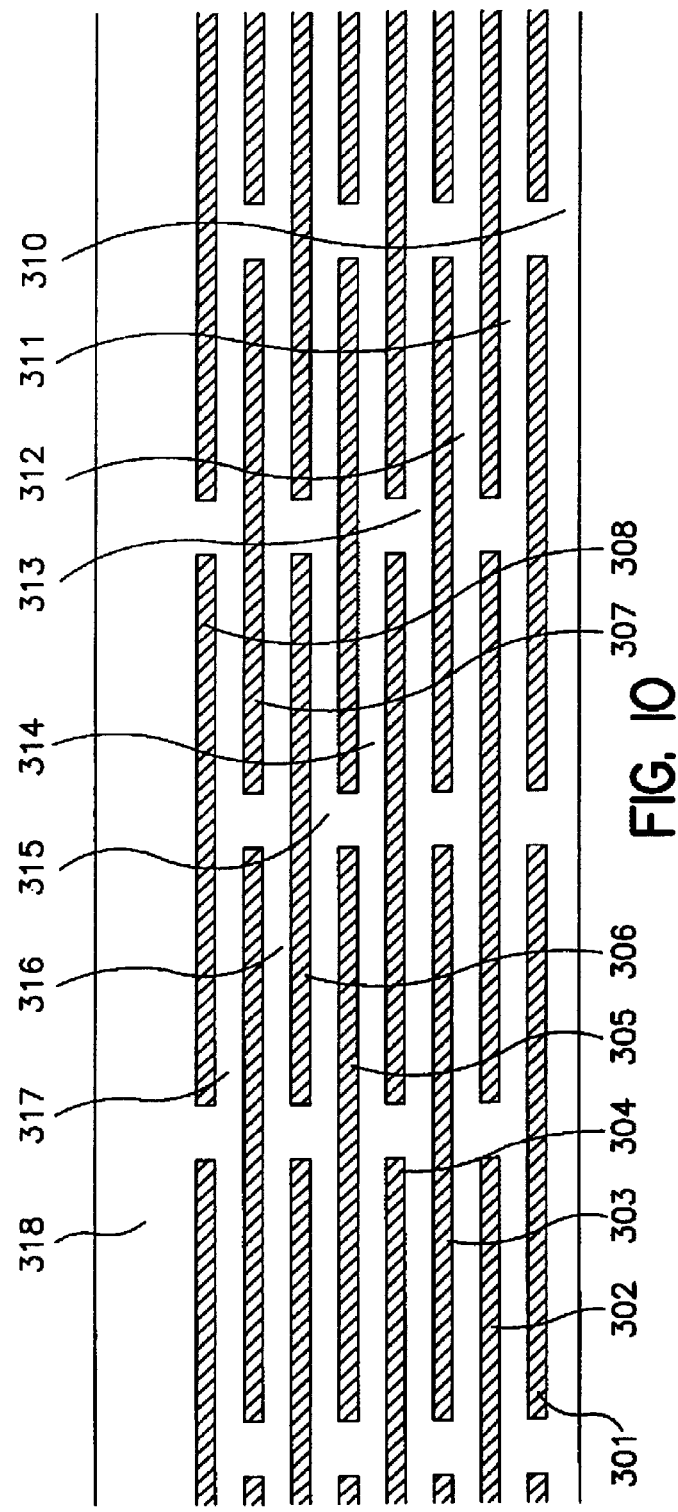
FIG. 10 is a cross-sectional view of a row manufacturing the formation of a final dielectric layer.

FIG. 9 illustrates a third dielectric layer 312 deposited on top of the second capacitor plate layer 302 and within the gaps 204" merging with the second dielectric layer 311. Additional conductive layers 303–308 and additional dielectric layers 313–318 may alternately be deposited in a like manner on top of dielectric layer 312 to form additional capacitor plate layers to increase the capacitance of the capacitors 200 as illustrated by FIG. 10. These layers may be deposited in accordance with the description of FIGS. 6A through 9.

FIG. 10 illustrates the result of depositing 8 conductive layers and 10 dielectric layers. Dielectric layers 313 through 318 and conductive layers 303 through 308 were added to the layers illustrated in FIG. 9. The base or first dielectric layer 310 and the final dielectric layer 318 may be thicker than other dielectric layers in order to protect the capacitor plates 300. The 8 conductive layers generate the 8 layers of capacitor plates 301 through 308. Substantial capacitance is provided by the overlap of capacitor plates formed at each layer of the capacitor late layers 301 through 308. The amount of capacitance is dependent on the overlapping areas between the capacitor plates and their separation due to the thickness of the dielectric layers between them. As illustrated by FIG. 10, capacitor plates at alternating layers of capacitor plate layers 301 through 308 are staggered or offset between even layers and odd layers to form non-overlapping areas for the column saw areas 204A through 204E. Additional dielectric layers and conductive layers may be added to further increase capacitance of the capacitor, though at some point it may be easier to stack smaller capacitors as is subsequently described.

After the dielectric layers and the capacitor plate layers have been formed, the connections between the rows of series connected capacitors need to be severed to allow formation of capacitor terminals. Referring now to FIG. 11, a top view of the wafer of capacitors 100 prior to vertical sawing is illustrated. In order to sever the connections in the row of series connected capacitors, the wafer of capacitors 100 are vertically cut or otherwise separated at column saw regions 1104 which correspond with the column saw areas 204A through 204E of the capacitor rows 101. The vertical sawing results in separate capacitor columns 1106. A semiconductor wafer saw preferably on the order of a 0.0015 inch thick may be used to cut through the column saw regions 1104. Alternatively a laser may be used to provide the vertical cuts. The preferable thickness of the capacitors may range between 10 microns and 200 microns depending upon the desired capacitance, voltage rating, and the capabilities of the manufacturing process.

Figure 13A:
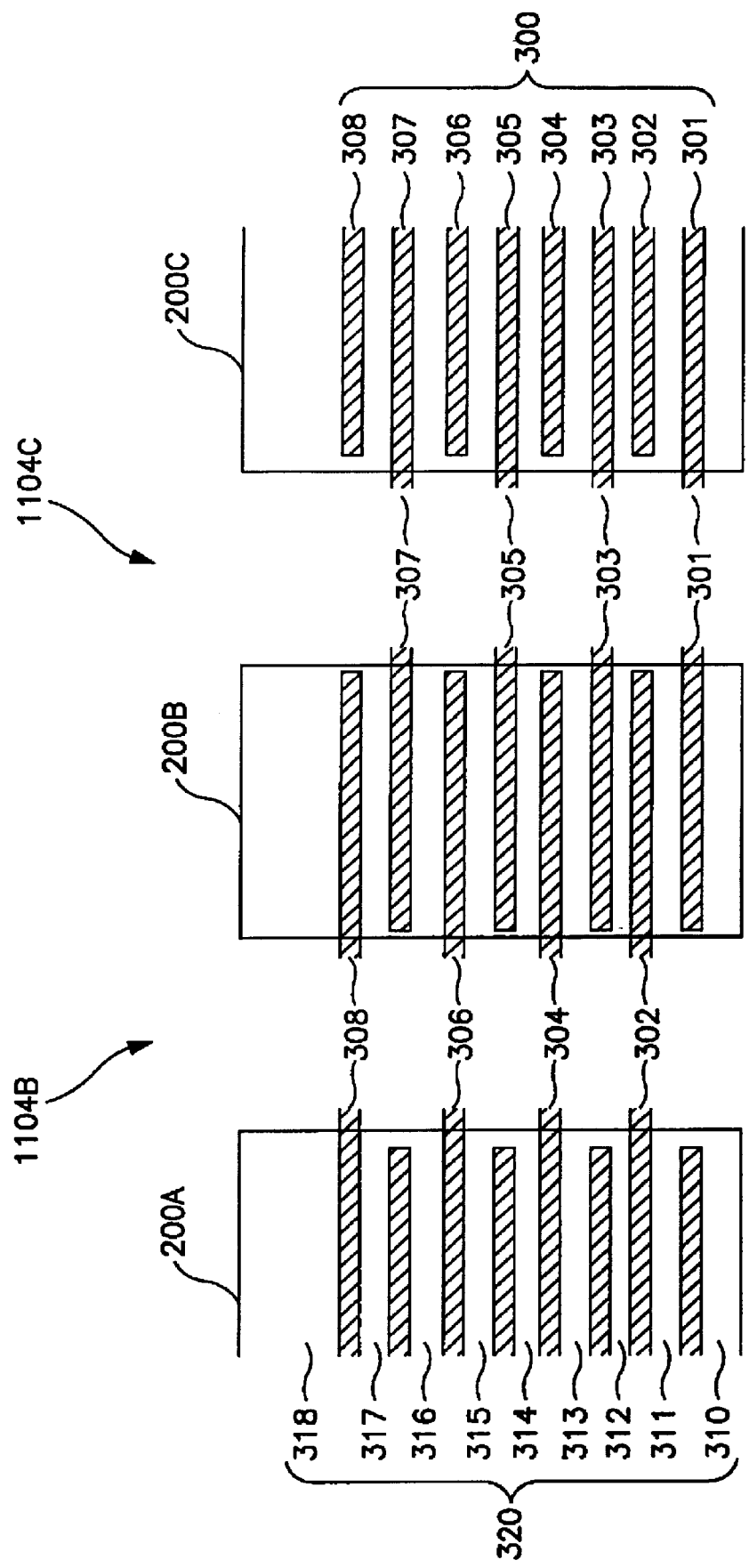
FIGS. 13A through 13C are cross-sectional views during manufacturing illustrating the formation of the capacitor terminals for the capacitors.

Referring now to FIG. 12A, a top view of a portion of the capacitor row 101 after completion of the vertical sawing of the column saw areas 204A through 204E is illustrated. FIG. 12B illustrates a cross-section of a row portion with capacitor plates 300 and dielectric layers 320 being cut at column saw regions 1104A through 1104E. End contact areas of each layer of capacitor plates 300 are exposed at alternate sides of each capacitor 200A through 200E. In one method of manufacturing, a final conductive layer may be directly deposited to fill the cuts and make electrical contact with the exposed ends of the capacitor plates. In another method of manufacture, the contact areas of the capacitor plates may be better exposed prior to deposition of the final conductive layer. By way of example, a dielectric etch may be used prior to the final conductive layer deposition, with or without a backsputter to clean the dielectric etch. FIG. 13A illustrates capacitors 200A through 200C having a dielectric etch such that end contact points of the capacitor plates 300 on layers 301 through 308 are further exposed at the sides of capacitors 200A through 200C prior to depositing the final conductive layer to form the capacitor terminals.

Figure 13B:
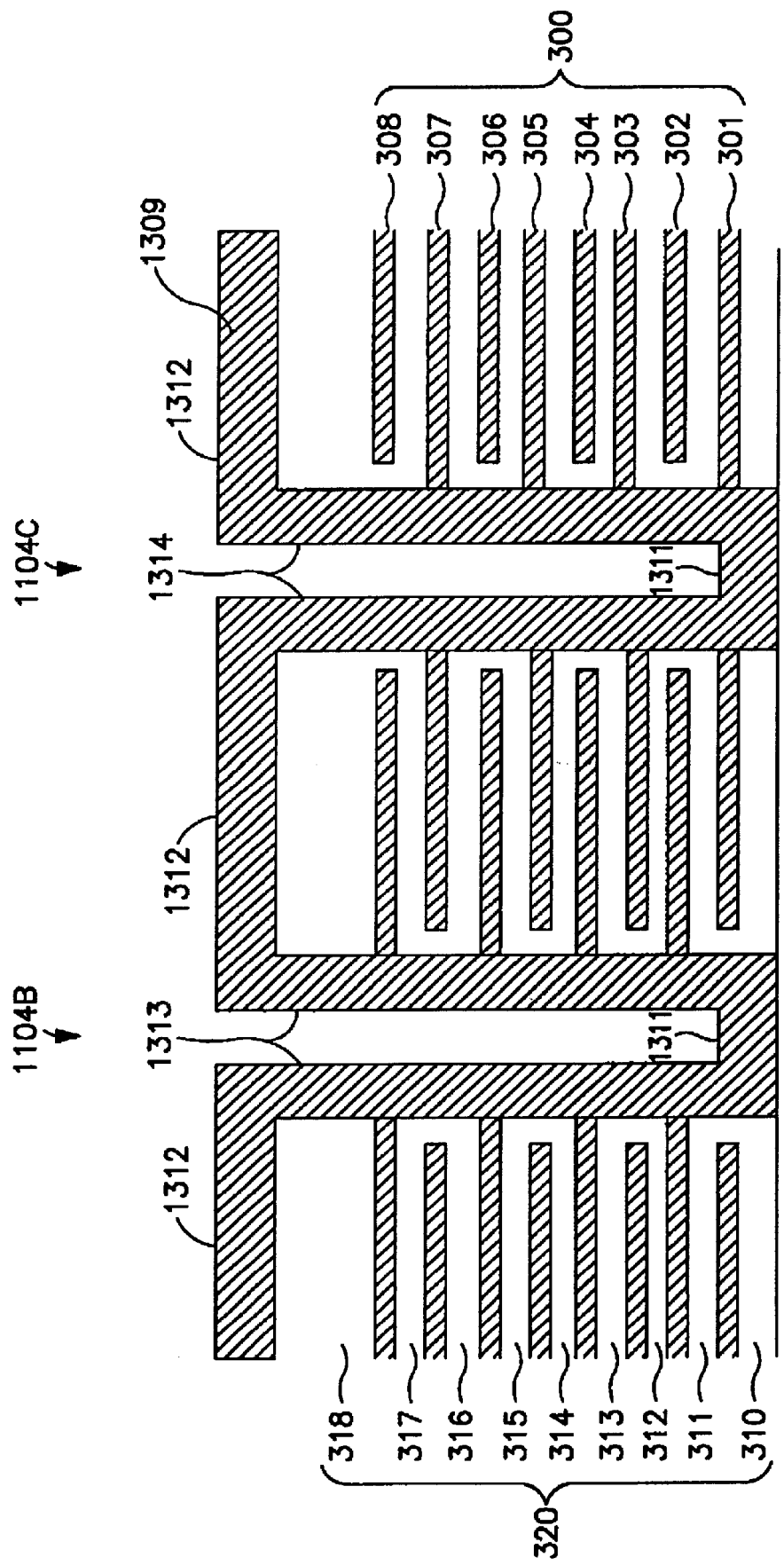
Figure 13C:
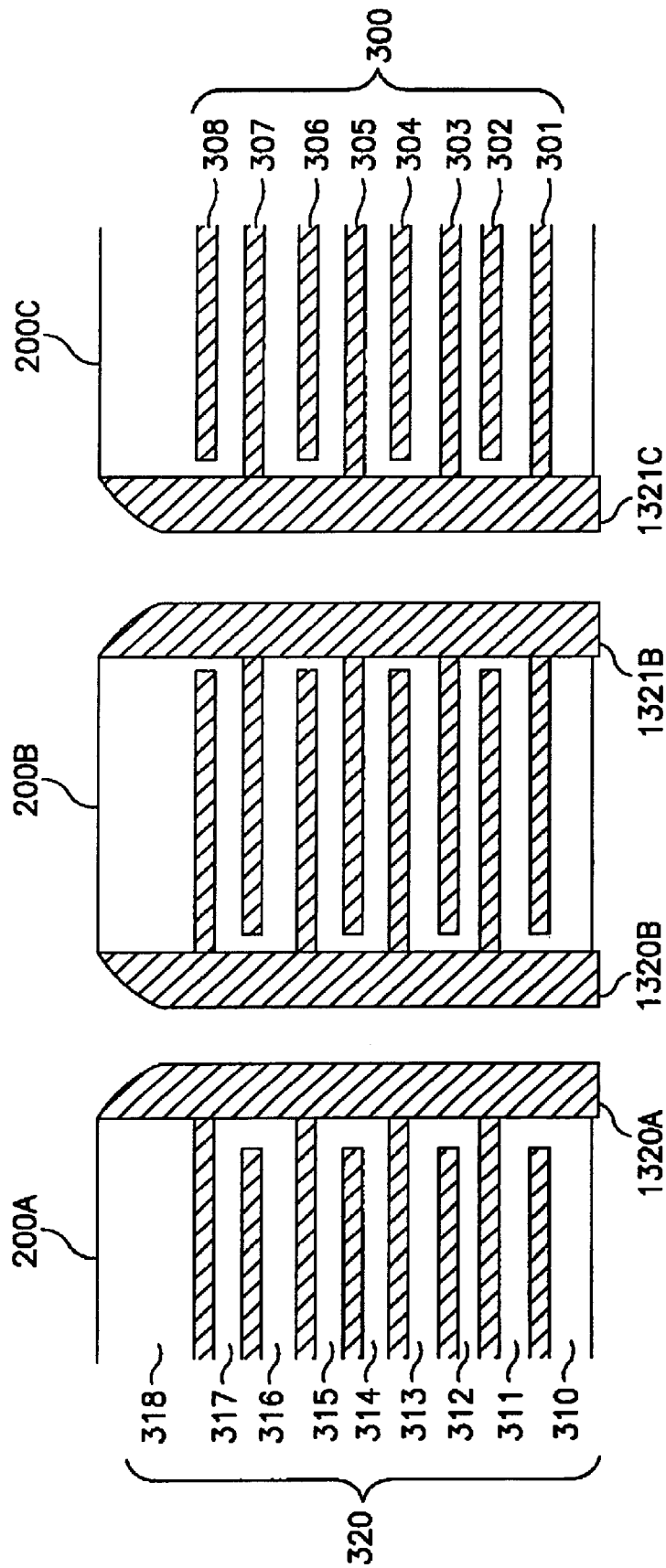

In order to form terminals for each capacitor 200, a final conductive layer is directly deposited. FIG. 13B illustrates the final conductive layer 1309 in the initial step of forming the capacitor terminals. The final conductive layer 1309 is deposited across the entire surface, covering the top of each capacitor (horizontal portion 1312), the exposed sides within the column saw regions 1104A through 1104E (vertical portions 1313 and 1314) and the bottom of the column saw regions (horizontal portion 1311) as illustrated in FIG. 13B. The final conductive layer 1309 is preferably the same material as the capacitor plates 300, but may be a solderable material such as titanium, silver or nickel. Vertical portions 1313 couple to end contact points of the capacitor plates 302, 304, 306, and 308. Vertical portions 1314 couple to end contact points of the capacitor plates 301, 303, 305, and 307. Upon deposition of the final conductive layer 1309, the capacitor plates 301–308 (collectively 300) are momentarily connected together. In order to remove the connections between the capacitor plates, the final conductive layer 1309 at horizontal portions 1311 and 1312 is etched away by using a vertical etch. The vertical etch is an anisotropic dry etch which can be performed using reactive ion etching systems and removes material from horizontal portions 1311 and 1312 and not the vertical portions 1313 and 1314, except for rounding corners as shown in FIG. 13C. To protect the capacitor plates 300 from the vertical etch, the final dielectric layer 318 may deposited thicker than others such that the etch can remove some thickness making the dielectric layer 318 thinner without damage.

FIG. 13C illustrates capacitors 200A through 200C with the horizontal portions 1311 and 1312 of the final conductive layer 1309 removed. The remaining vertical portions 1313 form the terminals 1320 and the remaining vertical portions 1314 form the terminals 1321 after the vertical etch. This results in capacitor plates defined by layers 301, 303, 305, and 307 being coupled to terminals 1321 and capacitor plates defined by layers 302, 304, 306, and 308 being coupled to terminals 1320. In FIG. 13C, capacitor 200B has a first terminal 1320B coupled to the capacitor plates defined by layers 302, 304, 306, and 308 and a second terminal 1321B coupled to the capacitor plates defined by layers 301, 303, 305, and 307.

After forming the terminals 1320 and 1321, the capacitors 200 remain in parallel but disconnected form in the capacitor columns 1106. In order to separate the parallel capacitors into discrete form, a horizontal sawing or other separation step is performed along each of the scribe areas 205A and 205B next to capacitors 200. This is the final dicing operation to obtain separate discrete thin film capacitors 200. After final dicing, discrete capacitors 200 are suitable for use in printed circuit boards using surface mount technology. If desirable, the discrete capacitors 200 can have wire leads attached to the terminals 1320 and 1321 by soldering and then they may be encapsulated by an epoxy or other encapsulation material for insertion into circuits of printed circuit boards.

FIGS. 14A and 14B each illustrate a simplified cross sectional diagram of a single discrete thin film capacitor 200. In FIG. 14A, the dielectric back etch steps were used in the coupling between the capacitor terminals 1320 and 1321 and the capacitor plates 300. In FIG. 14B, no side dielectric etch was used in the connection between the terminals 1320 and 1321 and capacitor plates 300.

Figure 15A:
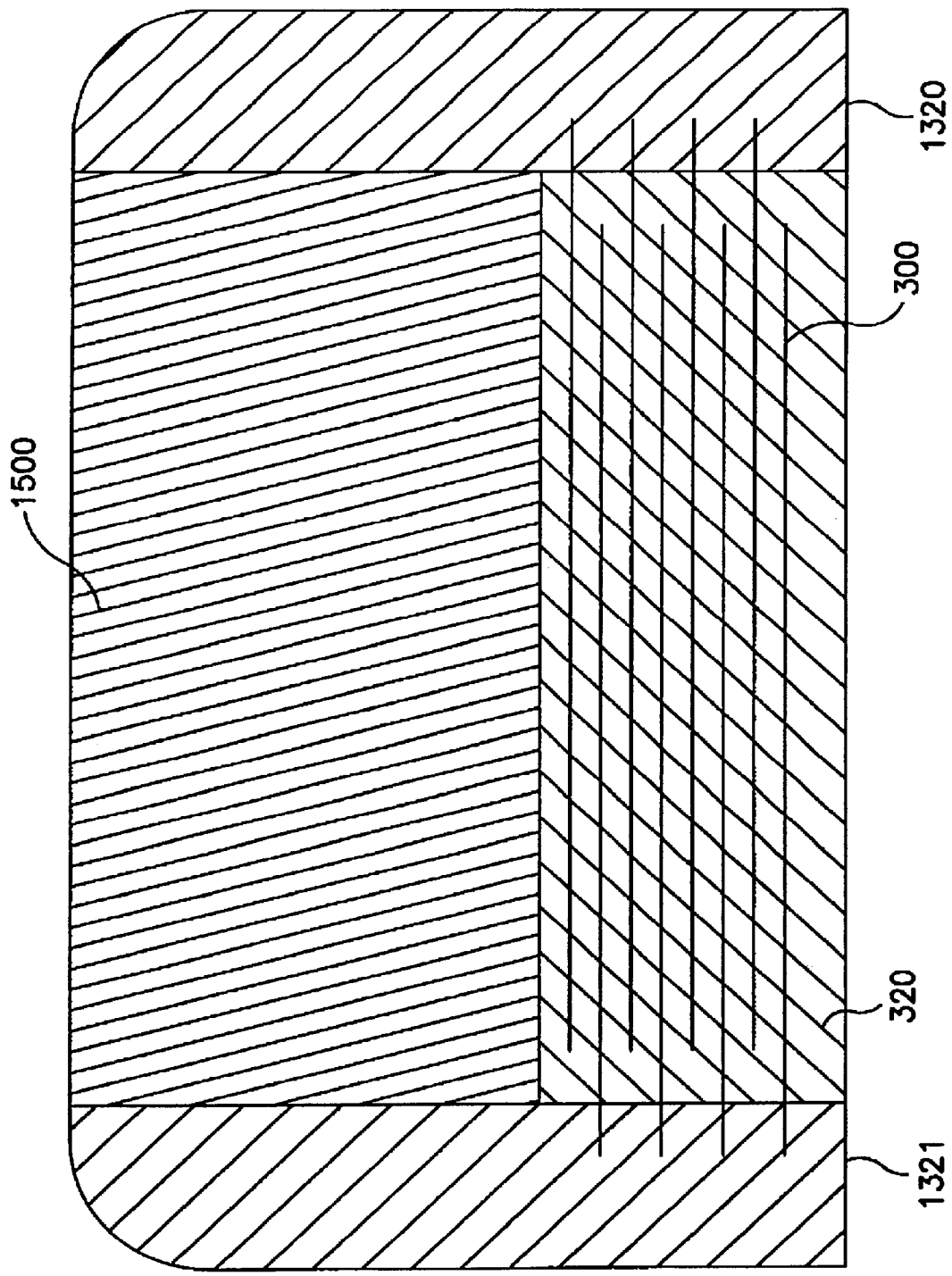
FIGS. 15A and 15B are cross-sectional views of alternate embodiments of the batch processed thin film capacitor.
Figure 15B:
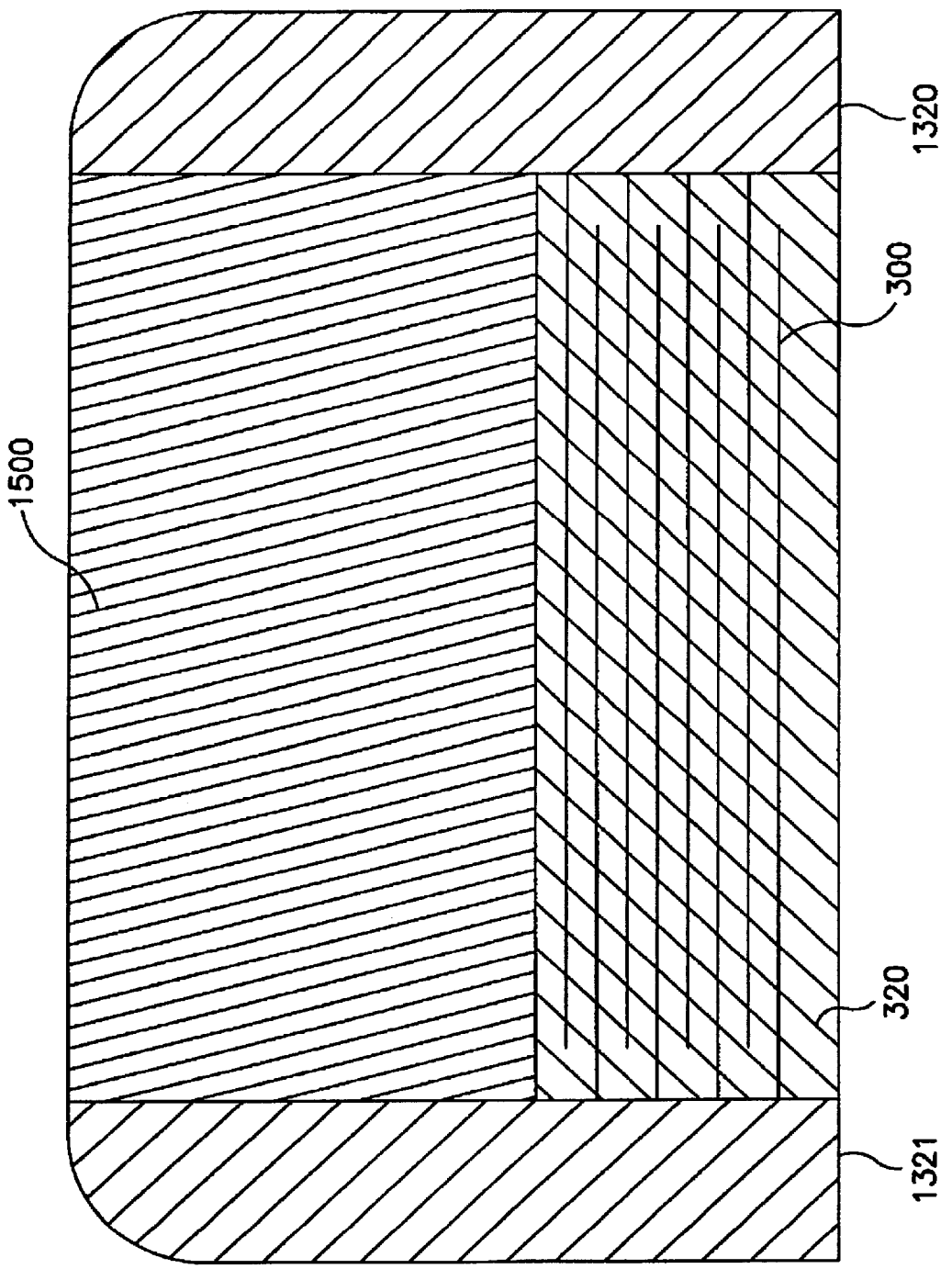

FIGS. 15A and 15B each illustrate a simplified cross sectional diagram of a single discrete thin film capacitor 200 having additional manufacturing steps. Prior to vertically sawing, as illustrated by FIG. 11, the wafer of capacitors 100 are subjected to another deposition of a layer of an insulating material 1500. Insulating material 1500 provides improved protection to the capacitor plates 300 and provides for the formation of larger capacitor terminals 1320 and 1321. FIG. 15A illustrates a simplified diagram of each single discrete thin film capacitor 200 having a side dielectric etch to reduce the resistance in the coupling between the capacitor terminals 1320 and 1321. FIG. 15B illustrates a simplified diagram of each single discrete thin film capacitor 200 having the extra deposition of insulating material 1500 but formed without having the side dielectric etch step performed.

Figure 16B:
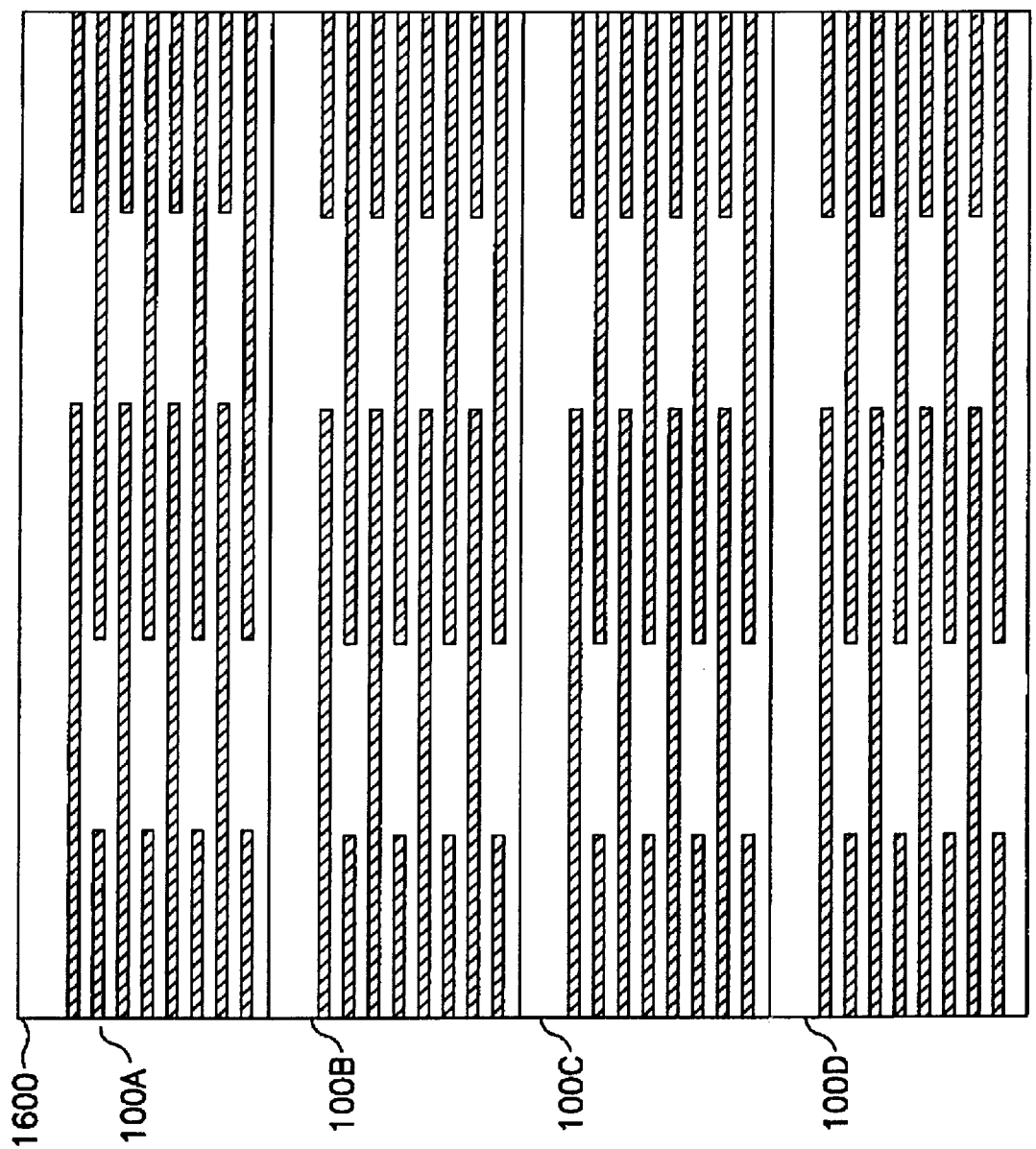
FIG. 16B illustrates a cross-sectional view of a row of stacked capacitors of FIG. 16A.
Figure 16A:
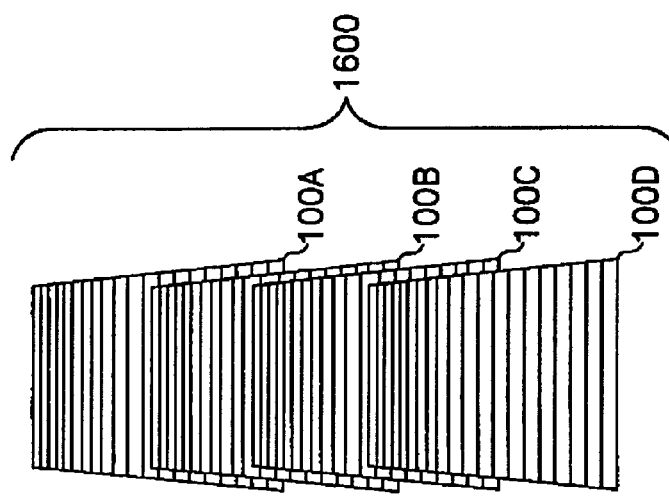
FIG. 16A illustrates an exploded view of stacked capacitors formed to further increase capacitance.
Figure 16C:
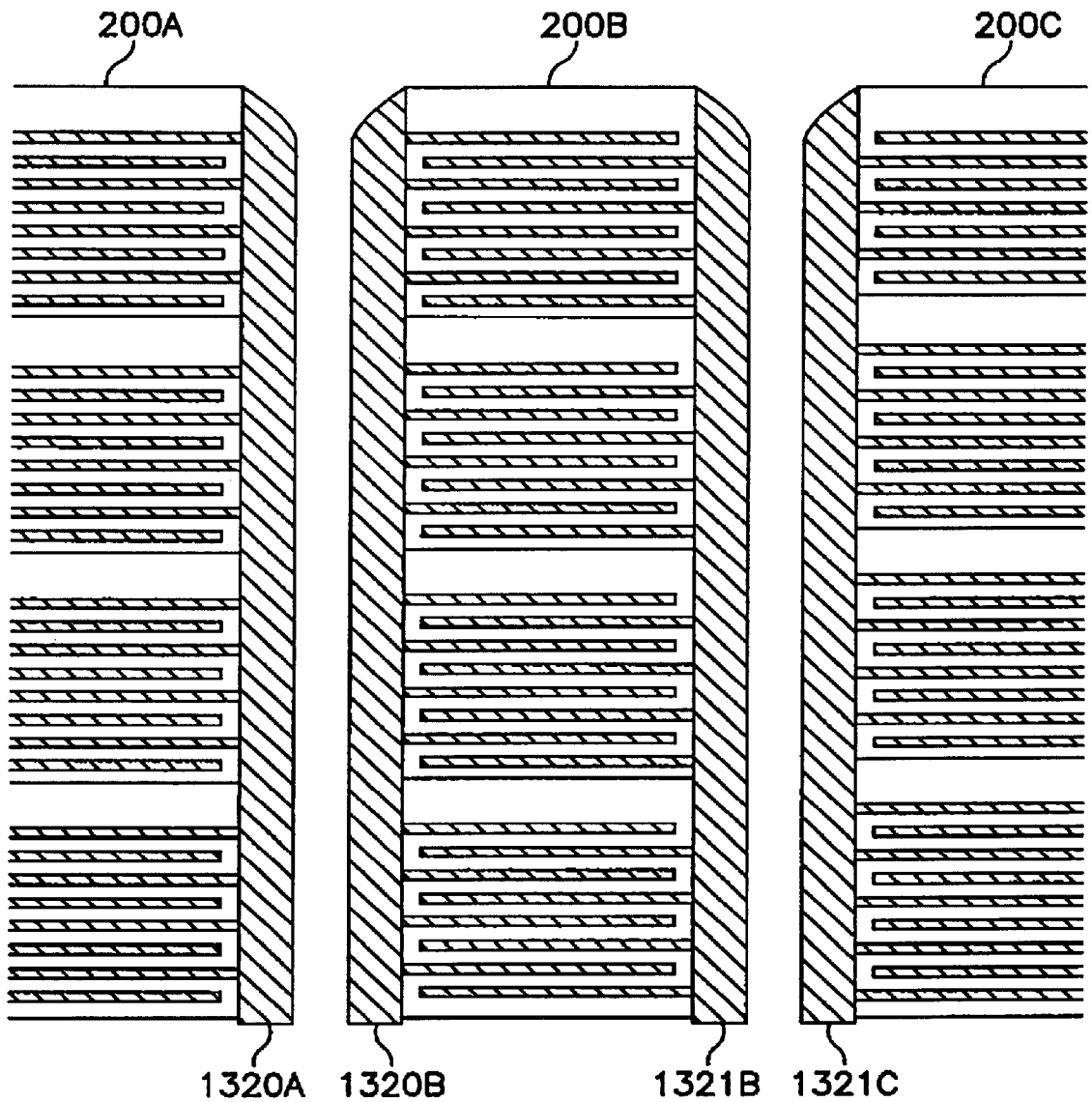
FIG. 16C illustrates a cross-sectional view of a row of stacked capacitors in discrete form with capacitor terminals.

While the multiple layers in the thin film manufacturing steps provide increased capacitance, there is a point of diminished return where the processing throughput suffers as a result of adding additional layers of dielectric and capacitor plates to the same structure. Thus, it is desirable to increase the capacitance further without adding additional layers by coupling discrete thin film capacitors 200 in parallel together in order to enjoy increased manufacturing throughput for batch processed capacitors. This may be accomplished by stacking individual wafers of capacitors 100 on top of one another and aligning them together prior to any sawing or separation. A visual alignment is generally adequate because the alignment is not critical in the formation of the capacitor plates. If a substrate 501 is utilized in manufacturing of the capacitors 200, it is stripped off to reveal a smooth bottom dielectric surface. The top and bottom of surfaces of each wafer of capacitors 100 in the stack have relatively smooth flat surfaces after processing is completed such that air pockets would not develop when coupled to another flat surface. The wafers of capacitors 100 are inherently held together by coupling the flat surfaces together similar to two pieces of glass that would stick together by interstitial contact. FIG. 16A illustrates stacking wafers of capacitors 100A through 100D on top of one another into a wafer stack 1600 prior to separation of the column areas 204A through 204E of the capacitors 200. FIG. 16B shows a side cross-section of wafers of capacitors 10A through 100D stacked upon one another into the wafer stack 1600 illustrating a portion of a capacitor row 101 prior to sawing or separation. After the wafers of capacitors 100 are stacked upon one another, processing continues similar to the processing previously described for a single capacitor structure where the column saw areas 204A through 204E are sliced by a wafer saw into stacked capacitor columns. After separation, a dielectric etch may occur or the final conductive layer may be directly deposited to begin formation of the capacitor terminals. The horizontal surfaces and shorts are again etched away by a vertical etch to complete the terminals. FIG. 16C illustrates the culmination of these steps. Terminals 1320 and 1321 of the wafer stack 1600 bind the layers together such that a sawing or separation step may occur down the scribe line rows to separate the columns of stacked thin film capacitors into individual discrete stacked thin film capacitors. The stacked thin film capacitor may be used for surface mount technology in its then existing form, or wire leads may be soldered to the terminals 1320 and 1321 and an encapsulation layer may surround the stacked thin film capacitor for protection.

The preferred embodiments of the present invention for method and apparatus for batch processed capacitors using masking techniques are thus described. While the present invention has been described in particular embodiments, the present invention should not be construed as limited by such embodiments, but rather construed according to the claims that follow below.

What is claimed is:

1. A method of manufacturing a batch of thin film capacitors, the method comprising:

depositing a first dielectric layer of a first thickness into an area to begin formation of a wafer;

forming rows of a first capacitor plate layer by depositing a first conductive layer in a first pattern, the first pattern further defining a plurality of row scribe areas and a plurality of first column saw areas devoid of the first conductive layer;

depositing a second dielectric layer of a second thickness on top of the first conductive layer;

forming rows of a second capacitive plate layer by depositing a second conductive layer in a second pattern, the second pattern further defining the plurality of row scribe areas and a plurality of second column saw areas devoid of the second conductive layer, whereby, rows of overlapping regions and non-overlapping regions are formed with the first capacitor plate layer;

depositing a final dielectric layer on top of the second conductive layer;

shaping the wafer into columns of capacitors by separating the wafer at each of the pluralities of first and second column saw areas;

forming first and second capacitor terminals by depositing a final conductive layer onto the wafer and into the first and second column saw areas to couple to capacitor plate layers and eliminating conductive regions formed between the first capacitor terminal and the second capacitor terminal by vertically etching horizontal surfaces of the final conductive layer; and shaping the wafer of capacitors into individual thin film capacitors by separating the columns of capacitors at each of the plurality of row scribe areas.

2. The method of claim 1 further comprising:

prior to depositing the final dielectric layer, depositing another dielectric layer on top of the prior conductive layer;

forming rows of another capacitor plate layer by depositing another conductive layer in the first or second pattern such that rows of overlapping regions and non-overlapping regions are formed with the prior capacitor plate layer and parallel to the capacitor plate layer preceding the prior capacitor plate layer; and, repeating the depositing of another dielectric layer and the forming rows of another capacitor plate layer until a number of desired capacitive plate layers of the batch of thin film capacitors is reached.

3. The method of claim 2, wherein, the first, the second and the another capacitor plate layer are formed using a shadow mask and depositing a conductive material through openings in the shadow mask onto the respective dielectric layer and shifting the shadow mask from the prior position on alternating layers of capacitor plate layers.

4. The method of claim 1 further comprising:

prior to shaping the wafer into columns, depositing a layer of insulating material to protect the capacitor plates.

5. The method of claim 4 wherein, the layer of insulating material is formed by adding additional thickness of a dielectric material to the final dielectric layer.

6. The method of claim 1 wherein, the capacitor plate layers are a conductive ceramic, conductive nitrite, or a metal or alloy material selected from the group consisting of copper, silver, aluminum, gold, platinum, and titanium.

7. A method of manufacturing a batch of thin film capacitors, the method comprising:

depositing a first dielectric layer of a first thickness to an area;

forming rows of a first capacitor plate layer by depositing a first conductive layer in a first pattern, the first pattern further defining a plurality of row scribe areas and a plurality of first column saw areas devoid of the first conductive layer;

depositing a second dielectric layer of a second thickness on top of the first conductive layer;

forming rows of a second capacitive plate layer by depositing a second conductive layer in a second pattern, the second pattern further defining the plurality of row scribe areas and a plurality of second column saw areas devoid of the second conductive layer, whereby, rows of overlapping regions and non-overlapping regions are formed with the first capacitor plate layer;

depositing a final dielectric layer on top of the second conductive layer;

forming columns of capacitors by separating at each of the pluralities of first and second column saw areas;

forming first and second capacitor terminals by depositing a final conductive layer including into the first and second column saw areas to couple to capacitor plate layers and eliminating conductive regions formed between the first capacitor terminal and the second capacitor terminal by vertically etching horizontal surfaces of the final conductive layer; and wherein the dielectric layers are a dielectric material selected from the group consisting of borophosphosilicate glass BPSG), tantalum-oxide, silicon-dioxide, silicon nitride and oxi-nitride.

8. The method of claim 7 further comprising:

separating the columns of capacitors at each of the plurality of row scribe areas to form individual thin film capacitors.

9. The method of claim 7 further comprising:

prior to depositing the final dielectric layer, depositing another dielectric layer on top of the prior conductive layer;

forming rows of another capacitor plate layer by depositing another conductive layer in the first or second pattern such that rows of overlapping regions and non-overlapping regions are formed with the prior capacitor plate layer and parallel to the capacitor plate layer preceding the prior capacitor plate layer; and, repeating the depositing of another dielectric layer and the forming rows of another capacitor plate layer until a number of desired capacitive plate layers of the batch of thin film capacitors is reached.

10. The method of claim 7 further comprising:

prior to forming columns of capacitors, depositing a layer of insulating material to protect the capacitor plate layers.

11. The method of claim 7 wherein, the conductive layers are a conductive ceramic, conductive nitrite, or a metal or alloy material selected from the group consisting of copper, silver, aluminum, gold, platinum, and titanium.

12. The method of claim 7 further comprising:

after forming columns of capacitors by separating at each of the pluralities of first and second column saw areas, etching the dielectric layers to clean contact points of the conductive layers.

13. The method of claim 7 further comprising:

after forming columns of capacitors by separating at each of the pluralities of first and second column saw areas, performing a backsputtering to clean contact points of the conductive layers.

14. The method of claim 1wherein, the final conductive layer is a solderable material.

15. The method of claim 14 wherein, wherein the solderable material is selected from the group consisting of titanium, silver and nickel.

16. The method of claim 14 further comprising:

separating the columns of capacitors at each of the plurality of row scribe areas to form individual thin film capacitors.

17. The method of claim 14 further comprising:

prior to depositing the final dielectric layer, depositing another dielectric layer on top of the prior conductive layer;

forming rows of another capacitor plate layer by depositing another conductive layer in the first or second pattern such that rows of overlapping regions and non-overlapping regions are formed with the prior capacitor plate layer and parallel to the capacitor plate layer preceding the prior capacitor plate layer; and, repeating the depositing of another dielectric layer and the forming rows of another capacitor plate layer until a number of desired capacitive plate layers of the batch of thin film capacitors is reached.

18. The method of claim 14 further comprising:

prior to forming columns of capacitors, depositing a layer of insulating material to protect the capacitor plate layers.

19. The method of claim 14 wherein, the conductive layers are a conductive ceramic, conductive nitrite, or a metal or alloy material selected from the group consisting of copper, silver, aluminum, gold, platinum, and titanium.

20. The method of claim 14 further comprising:

after forming columns of capacitors by separating at each of the pluralities of first and second column saw areas, etching the dielectric layers to clean contact points of the conductive layers.

21. The method of claim 14 further comprising:

after forming columns of capacitors by separating at each of the pluralities of first and second column saw areas, performing a backsputtering to clean contact points of the conductive layers.

22. The method of claim 14 wherein, the dielectric layers are a dielectric material selected from the group consisting of borophosphosilicate glass (BPSG), tantalum-oxide, silicon-dioxide, silicon nitride and oxi-nitride.

23. A method of manufacturing a batch of thin film capacitors, the method comprising:

forming rows of a first capacitor plate layer by depositing a first conductive layer in a first pattern, the first pattern further defining a plurality of row scribe areas and a plurality of first column saw areas devoid of the first conductive layer;

depositing a second dielectric layer of a second thickness on top of the first conductive layer;

forming rows of a second capacitive plate layer by depositing a second conductive layer in a second pattern, the second pattern further defining the plurality of row scribe areas and a plurality of second column saw areas devoid of the second conductive layer, whereby, rows of overlapping regions and non-overlapping regions are formed with the first capacitor plate layer;

depositing a final dielectric layer on top of the second conductive layer;

forming columns of capacitors by separating at each of the pluralities of first and second column saw areas;

performing a dielectric etch to clean contact points of the capacitor plates between the capacitor plates and the first and second terminals; and forming first and second capacitor terminals by depositing a final conductive layer including into the first and second column saw areas to couple to capacitor plate layers and eliminating conductive regions formed between the first capacitor terminal and the second capacitor terminal by vertically etching horizontal surfaces of the final conductive layer.

24. The method of claim 23 further comprising:

separating the columns of capacitors at each of the plurality of row scribe areas to form individual thin film capacitors.

25. The method of claim 23 further comprising:

prior to depositing the final dielectric layer,
depositing another dielectric layer on top of the prior conductive layer;
forming rows of another capacitor plate layer by depositing another conductive layer in the first or second pattern such that rows of overlapping regions and non-overlapping regions are formed with the prior capacitor plate layer and parallel to the capacitor plate layer preceding the prior capacitor plate layer; and,
repeating the depositing of another dielectric layer and the forming rows of another capacitor plate layer until a number of desired capacitive plate layers of the batch of thin film capacitors is reached.

26. The method of claim 23 further comprising:

prior to forming columns of capacitors,
depositing a layer of insulating material to protect the capacitor plate layers.

27. The method of claim 23 wherein, p1 the conductive layers are a conductive ceramic, conductive nitrite, or a metal or alloy material selected from the group consisting of copper, silver, aluminum, gold, platinum, and titanium.

28. The method of claim 23 further comprising:

after forming columns of capacitors by separating at each of the pluralities of first and second column saw areas, performing a backsputtering to clean contact points of the conductive layers.

29. The method of claim 23 wherein, the dielectric layers are a dielectric material selected from the group consisting of borophosphosilicate glass (BPSG), tantalum-oxide, silicon-dioxide, silicon nitride and oxi-nitride.

30. A The method of manufacturing a batch of thin film capacitors, the method comprising:

forming rows of a first capacitor plate layer by depositing a first conductive layer in a first pattern, the first pattern further defining a plurality of row scribe areas and a plurality of first column saw areas devoid of the first conductive layer;

depositing a second dielectric layer of a second thickness on top of the first conductive layer ;

forming rows of a second capacitive plate layer by depositing a second conductive layer in a second pattern, the second pattern further defining the plurality of row scribe areas and a plurality of second column saw areas devoid of the second conductive layer, whereby, rows of overlapping regions and non-overlapping regions are formed with the first capacitor plate layer;

depositing a final dielectric layer on top of the second conductive layer;

forming columns of capacitors by separating at each of the pluralities of first and second column saw areas;

performing a backsputtering to clean contact points of the capacitor plates between the capacitor plates and the first and second terminals; and forming first and second capacitor terminals by depositing a final conductive layer including into the first and second column saw areas to couple to capacitor plate layers and eliminating conductive regions formed between the first capacitor terminal and the second capacitor terminal by vertically etching horizontal surfaces of the final conductive layer.

31. The method of claim 30 further comprising:

separating the columns of capacitors at each of the plurality of row scribe areas to form individual thin film capacitors.

32. The method of claim 30 further comprising:

prior to depositing the final dielectric layer,
depositing another dielectric layer on top of the prior conductive layer;
forming rows of another capacitor plate layer by depositing another conductive layer in the first or second pattern such that rows of overlapping regions and non-overlapping regions are formed with the prior capacitor plate layer and parallel to the capacitor plate layer preceding the prior capacitor plate layer; and, repeating the depositing of another dielectric layer and the forming rows of another capacitor plate layer until a number of desired capacitive plate layers of the batch of thin film capacitors is reached.

33. The method of claim 30 further comprising:

prior to forming columns of capacitors,
depositing a layer of insulating material to protect the capacitor plate layers.

34. The method of claim 30 wherein,
the conductive layers are a conductive ceramic, conductive nitrite, or a metal or alloy material selected from the group consisting of copper, silver, aluminum, gold, platinum, and titanium.

35. The method of claim 30 wherein,
the dielectric layers are a dielectric material selected from the group consisting of borophosphosilicate glass (BPSG), tantalum-oxide, silicon-dioxide, silicon nitride and oxi-nitride.

36. A method of manufacturing a batch of thin film capacitors, the method comprising:

depositing a first dielectric layer of a first thickness into an area;

forming rows of a first capacitor plate layer by depositing a first conductive layer in a first pattern, the first pattern further defining a plurality of row scribe areas and a plurality of first column saw areas devoid of the first conductive layer;

depositing a second dielectric layer of a second thickness on top of the first conductive layer;

forming rows of a second capacitive plate layer by depositing a second conductive layer in a second pattern, the second pattern further defining the plurality of row scribe areas and a plurality of second column saw areas devoid of the second conductive layer, whereby, rows of overlapping regions and non-overlapping regions are formed with the first capacitor plate layer;

depositing another dielectric layer on top of the prior conductive layer;

forming rows of another capacitor plate layer by depositing another conductive layer in the first or second pattern such that rows of overlapping regions and non-overlapping regions are formed with the prior capacitor plate layer and parallel to the capacitor plate layer preceding the prior capacitor plate layer;

repeating the depositing of another dielectric layer and the forming rows of another capacitor plate layer until a number of desired capacitive plate layers of the batch of thin film capacitors is reached;

depositing a final dielectric layer on top of the second conductive layer;

forming columns of capacitors by separating at each of the pluralities of first and second column saw areas;

forming first and second capacitor terminals by depositing a final conductive layer including into the first and second column saw areas to couple to capacitor plate layers and eliminating conductive regions formed between the first capacitor terminal and the second capacitor terminal by vertically etching horizontal surfaces of the final conductive layer; and wherein the first, the second and the another capacitor plate layer are formed by depositing a plane of conductive material and a plane of photo-resist on top of the conductive material and using a photo mask to expose and develop a pattern in the photo-resist to the etch areas out of the conductive material in response to the pattern and shifting the photo mask from the prior position on alternating layers of capacitor plate layers to etch an alternating layer pattern.

37. The method of claim 36 further comprising:

separating the columns of capacitors at each of the plurality of row scribe areas to form individual thin film capacitors.

38. The method of claim 36 further comprising:

prior to depositing the final dielectric layer,
depositing another dielectric layer on top of the prior conductive layer;

forming rows of another capacitor plate layer by depositing another conductive layer in the first or second pattern such that rows of overlapping regions and non-overlapping regions are formed with the prior capacitor plate layer and parallel to the capacitor plate layer preceding the prior capacitor plate layer; and, repeating the depositing of another dielectric layer and the forming rows of another capacitor plate layer until a number of desired capacitive plate layers of the batch of thin film capacitors is reached.

39. The method of claim 36 further comprising:

prior to forming columns of capacitors,
depositing a layer of insulating material to protect the capacitor plate layers.

40. The method of claim 36 wherein,
the conductive layers are a conductive ceramic, conductive nitrite, or a metal or alloy material selected from the group consisting of copper, silver, aluminum, gold, platinum, and titanium.

41. The method of claim 36 further comprising:

after forming columns of capacitors by separating at each of the pluralities of first and second column saw areas, etching the dielectric layers to clean contact points of the conductive layers.

42. The method of claim 36 further comprising:

after forming columns of capacitors by separating at each of the pluralities of first and second column saw areas, performing a backsputtering to clean contact points of the conductive layers.

43. The method of claim 36 wherein,
the dielectric layers are a dielectric material selected from the group consisting of borophosphosilicate glass (BPSG), tantalum-oxide, silicon-dioxide, silicon nitride and oxi-nitride.

44. A method of increasing capacitance of a thin film capacitor by forming a wafer stack capacitor, the method comprising:

a) stacking a plurality of wafers having batch processed thin film capacitors without terminals deposed therein to form a wafer stack, each of the plurality of wafers having a first and second column saw areas defining the thin film capacitors without terminals and a first plurality of spaced apart capacitor plate layers, a second plurality of spaced apart capacitor plate layers, the second plurality of spaced apart capacitor plate layers interleaved between and forming an overlapping region and first and second non overlapping regions with the first plurality of spaced apart capacitor plate layers, and a plurality of dielectric layers interleaved between and coupled to the first and second plurality of spaced apart capacitor plate layers to separate the first and second plurality of spaced apart capacitor plate layers and increase a capacitance of the thin film capacitors;

b) aligning the plurality of wafers of the wafer stack in alignment with each other such that the batch processed thin film capacitors deposed in each wafer are parallel; separating the wafer stack into stacked columns of capacitors at each of the plurality of wafers first and second column saw areas;

d) forming first and second capacitor terminals by depositing a final conductive layer onto a top wafer of the wafer stack and into the first and second column saw areas for coupling the capacitor plate layers of each wafer together and eliminating conductive regions formed between the first capacitor terminal and the second capacitor terminal by vertically etching horizontal surfaces of the final conductive layer; and, e) separating the stacked columns of capacitors into individual stacked capacitors at each of the plurality of row scribe areas of the stacked columns of capacitors.

45. The method of claim 44 wherein, the capacitor plate layers are a conductive ceramic, conductive nitrite, or a metal or alloy material selected from the group consisting of copper, silver, aluminum, gold, platinum, and titanium.

46. The method of claim 44 wherein, the dielectric layers are a dielectric material selected from the group consisting of borophosphosilicate glass (BPSG), tantalum-oxide, silicon-dioxide, silicon nitride and oxi-nitride.

47. The method of claim 44 wherein, the final conductive layer is a solderable material.

48. The method of claim 44 wherein, wherein the solderable material is from the set of titanium, silver and nickel.

49. A method of forming a batch processed thin film capacitor, the method comprising:

forming a first plurality of spaced apart capacitor plate layers having first end contact points;

interleaving a second plurality of spaced apart capacitor plate layers with the first plurality of spaced apart capacitor plate layers to form an overlapping region and first and second non overlapping regions between the first and second plurality spaced apart capacitor plate layers;

interleaving a plurality of dielectric layers between the first and second plurality of spaced apart capacitor plate layers;

vertically sawing through the interleaved layers at saw regions to form first end contact points of the first plurality of spaced apart capacitor plate layers and second end contact points of the second plurality of spaced apart capacitor plate layers;

depositing a final conductive layer over the surface of the thin film capacitor including into the vertically sawed areas of the interleaved layers; and vertically etching horizontal surfaces of the final conductive layer to form a first capacitor terminal coupled to the first plurality of spaced apart capacitor plate layers at the first end contact points and a second capacitor terminal coupled to the second plurality of spaced apart capacitor plate layers at the second end contact points.

50. The method of claim 49 wherein, the first plurality of spaced apart capacitor plate layers and the second plurality of spaced apart capacitor plate layers are a conductive ceramic, conductive nitrite, or a metal or alloy material selected from the group consisting of copper, silver, aluminum, gold, platinum, and titanium.

51. The method of claim 49 wherein, the first and second terminals are material selected from the group consisting of titanium, silver and nickel for soldering to a printed circuit board.

52. The method of claim 49 further comprising:

prior to depositing the final conductive layer, depositing a layer of insulating material on a final dielectric layer of the plurality of dielectric layers, the layer of insulating material to protect the first and second plurality of capacitor plates.

53. The method of claim 49 further comprising:

soldering first and second wire leads to first and second capacitor terminals respectively for insertion into a printed circuit board, and surrounding the thin film capacitor with an encapsulation layer for protection.

54. A method of forming a batch processed thin film capacitor, the method comprising:

forming a first plurality of spaced apart capacitor plate layers having first end contact points;

interleaving a second plurality of spaced apart capacitor plate layers with the first plurality of spaced apart capacitor plate layers to form an overlapping region and first and second non overlapping regions between the first and second plurality of spaced apart capacitor plate layers;

interleaving a plurality of dielectric layers between the first and second plurality of spaced apart capacitor plate layers;

vertically sawing through the interleaved layers at saw regions to form first end contact points of the first plurality of spaced apart capacitor plate layers and second end contact points of the second plurality of spaced apart capacitor plate layers;

etching vertical surfaces of the interleaved dielectric layers exposed by the vertical sawing to further expose the first and second end contact points;

depositing a final conductive layer over the surface of the thin film capacitor including into the vertically etched areas of the interleaved layers; and vertically etching horizontal surfaces of the final conductive layer to form a first capacitor terminal coupled to the first plurality of spaced apart capacitor plate layers at the first end contact points and a second capacitor terminal coupled to the second plurality of spaced apart capacitor plate layers at the second end contact points.

55. The method of claim 54 wherein, the first plurality of spaced apart capacitor plate layers and the second plurality of spaced apart capacitor plate layers are a conductive ceramic, conductive nitrite, or a metal or alloy material selected from the group consisting of copper, silver, aluminum, gold, platinum, and titanium.

56. The method of claim 54 wherein, the dielectric layers are a dielectric material selected from the group consisting of borophosphosilicate glass (BPSG), tantalum-oxide, silicon-dioxide, silicon nitride and oxi-nitride.

57. The method of claim 54 wherein, the first and second terminals are material selected from the group consisting of titanium, silver and nickel for soldering to a printed circuit board.

58. The method of claim 36 further comprising:

prior to depositing the final conductive layer, depositing a layer of insulating material on a final dielectric layer of the plurality of dielectric layers, the layer of insulating material to protect the first and second plurality of capacitor plates and to increase the dimensions of the first and second capacitor terminals.

59. The method of claim 54 further comprising:

soldering first and second wire leads to first and second capacitor terminals respectively for insertion into a printed circuit board, and surrounding the thin film capacitor with an encapsulation layer for protection.

60. The method of claim 54 further comprising:

vertically sawing through scribe areas to form individual thin film capacitors.

61. A method of forming a batch processed film capacitor, the method comprising:

forming a first plurality of spaced apart capacitor plate layers having first end contact points;

interleaving a second plurality of spaced apart capacitor plate layers with the first plurality of spaced apart capacitor plate layers to form an overlapping region and first and second non overlapping regions between the first and second plurality of spaced apart capacitor plate layers;

interleaving a plurality of dielectric layers between the first and second plurality of spaced apart capacitor plate layers, wherein the dielectric layers are a dielectric material selected from the group consisting of borophosphosilicate glass (BPSG), tantalum-oxide, silicon-dioxide, silicon nitride and oxi-nitride;

vertically sawing through the interleaved layers at saw regions to form first end contact points of the first plurality of spaced apart capacitor plate layers and second end contact points of the second plurality of spaced apart capacitor plate layers;

depositing a final conductive layer over the surface of the thin film capacitor including into the vertically etched areas of the interleaved layers; and vertically etching horizontal surfaces of the final conductive layer to form a first capacitor terminal coupled to the first plurality of spaced apart capacitor plate layers at the first end contact points and a second capacitor terminal coupled to the second plurality of spaced apart capacitor plate layers at the second end contact points.

62. The method of claim 61 wherein, the first plurality of spaced apart capacitor plate layers and the second plurality of spaced apart capacitor plate layers are a conductive ceramic, conductive nitrite, or a metal or alloy material selected from the group consisting of copper, silver, aluminum, gold, platinum, and titanium.

63. The method of claim 61 wherein, the first and second terminals are material selected from the group consisting of titanium, silver and nickel for soldering to a printed circuit board.

64. The method of claim 61 further comprising:

prior to depositing the final conductive layer, depositing a layer of insulating material on a final dielectric layer of the plurality of dielectric layers, the layer of insulating material to protect the first and second plurality of capacitor plates.

65. The method of claim 61 further comprising:

soldering first and second wire leads to first and second capacitor terminals respectively for insertion into a printed circuit board, and surrounding the thin film capacitor with an encapsulation layer for protection.

66. The method of claim 61 further comprising:

vertically sawing through scribe areas to form individual thin film capacitors.

67. A method of forming a matrix of batched processed discrete thin film capacitors, the method comprising:

forming a thin film dielectric layer into a shape of a wafer, depositing a plurality of first and second patterns of thin film conductive material across the wafer at different layers, the patterns of thin film conductive material arranged in rows and columns responsive to a first capacitor plate mask and a second capacitor plate mask, the first and second patterns of thin film conductive material forming overlapping regions of thin film conductive material for capacitance, non-overlapping regions for column saw areas, and void regions of thin film conductive material for scribe line areas;

depositing a plurality of dielectric layers across the wafer interleaved between the first and second patterns of thin film conductive material to separate the respective layers of the first and second patterns of thin film conductive material and to increase capacitance; and, forming a plurality of first capacitor terminals coupled to the plurality of first patterns of thin film conductive material and a plurality of second capacitor terminals coupled to the plurality of second patterns of thin film conductive material.

68. The method of claim 67 wherein, the plurality of first and second capacitor terminals formed by separating the wafer at the column saw areas, depositing a final conductive layer across the wafer to couple to the plurality of first and second patterns of thin film conductive material and eliminating conductive regions formed between the first capacitor terminal and the second capacitor terminal by vertically etching horizontal surfaces of the final conductive layer deposed across the wafer.

69. The method of claim 67 wherein, the plurality of first and second patterns of thin film conductive material are a conductive ceramic, conductive nitrite, or a metal or alloy material selected from the group consisting of copper, silver, aluminum, gold, platinum, and titanium.

70. The method of claim 67 wherein, the plurality of first and second capacitor terminals are material selected from the group consisting of titanium, silver and nickel for soldering to a printed circuit board.

71. The method of claim 67 further comprising:

prior to the forming of the plurality of the first and second capacitor terminals, depositing a layer of insulating material coupled to a final layer of the thin film dielectric layers, the layer of insulating material to protect the thin film capacitor.

72. The method of claim 67 further comprising:

soldering first and second wire leads to first and second capacitor terminals respectively, the first and second wire leads for insertion into a printed circuit board, and surrounding the thin film capacitor with an encapsulation layer for protection.

73. A method of forming a matrix of batched processed discrete thin film capacitors, the method comprising:

forming a thin film dielectric layer into a shape of a wafer, depositing a plurality of first and second patterns of thin film conductive material across the wafer at different layers, the patterns of thin film conductive material arranged in rows and columns responsive to a first capacitor plate mask and a second capacitor plate mask, the first and second patterns of thin film conductive material forming overlapping regions of thin film conductive material for capacitance, non-overlapping regions for column saw areas, and void regions of thin film conductive material for scribe line areas;

depositing a plurality of dielectric layers across the wafer interleaved between the first and second patterns of thin film conductive material to separate the respective layers of the first and second patterns of thin film conductive material and to increase capacitance;

forming a plurality of first capacitor terminals coupled to the plurality of first patterns of thin film conductive material and a plurality of second capacitor terminals coupled to the plurality of second patterns of thin film conductive material; and wherein the dielectric layers are a dielectric material selected from the group consisting of borophosphosilicate glass (BPSG), tantalum-oxide, silicon-dioxide, silicon nitride and oxi-nitride.

74. The method of claim 73 wherein,
the plurality of first and second capacitor terminals formed by
separating the wafer at the column saw areas,
depositing a final conductive layer across the wafer to couple to the plurality of first and second patterns of thin film conductive material and
eliminating conductive regions formed between the first capacitor terminal and the second capacitor terminal by vertically etching horizontal surfaces of the final conductive layer deposed across the wafer.

75. The method of claim 73 wherein,
the plurality of first and second patterns of thin film conductive material are a conductive ceramic, conductive nitride, or a metal or alloy material selected from the group consisting of copper, silver, aluminum, gold, platinum, and titanium.

76. The method of claim 73 wherein,
the plurality of first and second capacitor terminals are material selected from the group consisting of titanium, silver and nickel for soldering to a printed circuit board.

77. The method of claim 73 further comprising:
prior to the forming of the plurality of the first and second capacitor terminals,
depositing a layer of insulating material coupled to a final layer of the thin film dielectric layers, the layer of insulating material to protect the thin film capacitor.

78. The method of claim 73 further comprising:
soldering first and second wire leads to first and second capacitor terminals respectively, the first and second wire leads for insertion into a printed circuit board, and
surrounding the thin film capacitor with an encapsulation layer for protection.

79. The method of claim 73 further comprising:
vertically sawing through scribe line areas to form individual thin film capacitors.

80. A method of manufacturing a batch of thin film capacitors, the method comprising:
providing a substrate layer having an area in the shape of a wafer;
depositing a first dielectric layer of a first thickness onto the area of the substrate;

depositing a first conductive layer in a first pattern after depositing the first dielectric layer to form rows of a first capacitor plate layer thereon, the first pattern further defining a plurality of row scribe areas and a plurality of first column saw areas lacking the first conductive layer;

depositing a second dielectric layer of a second thickness onto the first dielectric layer and the first pattern of the first conductive layer after depositing the first conductive layer;

depositing a second conductive layer in a second pattern after depositing the second dielectric layer to form rows of a second capacitive plate layer thereon, the second pattern further defining the plurality of row scribe areas and a plurality of second column saw areas lacking the second conductive layer, whereby, rows of overlapping regions and non-overlapping regions are formed with the first capacitor plate layer;

depositing another dielectric layer of another thickness onto a prior dielectric layer and a prior pattern of a prior conductive layer after depositing the prior conductive layer;

separating the wafer at each of the pluralities of first and second column saw areas to form columns of capacitors;

depositing a terminal conductive layer onto the wafer and into the first and second column saw areas to couple to capacitor plate layers;

vertically etching horizontal surfaces of the terminal conductive layer to form first and second capacitor terminals; and, separating the columns of capacitors at the plurality of row scribe areas to form a plurality of discrete thin film capacitors.

81. The method of claim 80 further comprising:
prior to separating the wafer,
depositing another conductive layer in the first or second pattern after depositing the another dielectric layer to form rows of another capacitor plate layer such that rows of overlapping regions and non-overlapping regions are formed with the prior capacitor plate layer;
repeating the depositing of the another dielectric layer and the depositing of the another conductive layer until a number of desired capacitive plate layers of the batch of thin film capacitors is reached; and,
depositing a final dielectric layer of another thickness onto a prior another dielectric layer and a prior pattern of a prior conductive layer.

82. The method of claim 80 further comprising:
prior to separating the wafer at each of the pluralities of first and second column saw areas,
depositing a layer of insulating material onto the another dielectric layer to protect the capacitor plates.

83. The method of claim 80 wherein,
the conductive layers are a conductive ceramic, conductive nitride, or a metal or alloy material selected from the group consisting of copper, silver, aluminum, gold, platinum, and titanium.

84. The method of claim 80 wherein, the dielectric layers are a dielectric material selected from the group consisting of borophosphosilicate glass (BPSG), tantalum-oxide, silicon-dioxide, silicon nitride and oxi-nitride.

85. The method of claim 80 further comprising:

after separating the wafer at each of the pluralities of first and second column saw areas, etching the dielectric layers to clean contact points of the conductive layers.

86. The method of claim 80 further comprising:

after separating the wafer at each of the pluralities of first and second column saw areas, performing a backsputtering to clean contact points of the conductive layers.

* * * * *